(12) United States Patent
Yoon et al.

(10) Patent No.: US 11,735,588 B2
(45) Date of Patent: Aug. 22, 2023

(54) SEMICONDUCTOR DEVICE

(71) Applicant: SAMSUNG ELECTRONICS CO., LTD., Suwon-si (KR)

(72) Inventors: Chan-Sic Yoon, Suwon-si (KR); Dongoh Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 299 days.

(21) Appl. No.: 16/663,574

(22) Filed: Oct. 25, 2019

(65) Prior Publication Data

US 2020/0312845 A1 Oct. 1, 2020

(30) Foreign Application Priority Data

Mar. 25, 2019 (KR) ........................ 10-2019-0033841

(51) Int. Cl.
*H01L 27/092* (2006.01)
*H01L 21/762* (2006.01)
*H10B 12/00* (2023.01)
*H01L 21/8238* (2006.01)
*H01L 21/8234* (2006.01)

(52) U.S. Cl.
CPC ...... *H01L 27/092* (2013.01); *H01L 21/76224* (2013.01); *H01L 21/823481* (2013.01); *H01L 21/823828* (2013.01); *H10B 12/09* (2023.02)

(58) Field of Classification Search
CPC ............. H01L 27/092; H01L 21/76232; H01L 21/823878; H01L 21/76224; H01L 27/10814; H01L 27/10894; H01L 27/10897; H01L 29/0649; H01L 29/0653; H01L 29/6681; H01L 21/823481; H01L 21/76237; H01L 21/76229; H10B 12/00–50

See application file for complete search history.

(56) References Cited

U.S. PATENT DOCUMENTS

| | | | |
|---|---|---|---|
| 7,135,372 B2 | 11/2006 | Huang et al. | |
| 8,053,323 B1 * | 11/2011 | Lin | ..................... H01L 29/7833 438/303 |
| 8,173,501 B2 | 5/2012 | Kronholz et al. | |
| 8,836,041 B2 * | 9/2014 | Loubet | .................. H01L 29/161 257/369 |
| 8,921,177 B2 | 12/2014 | Yeh et al. | |
| 9,378,950 B1 | 6/2016 | Lee et al. | |

(Continued)

FOREIGN PATENT DOCUMENTS

| | | |
|---|---|---|
| JP | 2002-043317 | 2/2002 |
| JP | 2002231804 A * | 8/2002 |

*Primary Examiner* — Younes Boulghassoul
*Assistant Examiner* — Quinton A Brasfield
(74) *Attorney, Agent, or Firm* — F. Chau & Associates, LLC

(57) ABSTRACT

A semiconductor device includes a substrate having a first region and a second region. A device isolation layer is disposed in the substrate between the first region and the second region. The device isolation layer includes a buried dielectric layer in a trench that is recessed from a top surface of the substrate. A first liner layer is between the trench and the buried dielectric layer. A semiconductor layer is disposed on a top surface of the substrate of the first region. A first gate pattern is disposed on the semiconductor layer. A protrusion is disposed on a top surface of the device isolation layer.

20 Claims, 17 Drawing Sheets

(56) References Cited

U.S. PATENT DOCUMENTS

| | | | |
|---|---|---|---|
| 9,595,585 B2 | 3/2017 | Mao | |
| 9,685,382 B1 | 6/2017 | Liu | |
| 2012/0043614 A1* | 2/2012 | Choi | H01L 21/28008 |
| | | | 257/369 |
| 2012/0139033 A1 | 6/2012 | Yamasaki et al. | |
| 2014/0167177 A1* | 6/2014 | Kim | H10B 10/12 |
| | | | 257/369 |
| 2016/0254179 A1* | 9/2016 | Yen | C23C 16/045 |
| | | | 257/506 |
| 2017/0117223 A1* | 4/2017 | Azmat | H01L 29/0653 |
| 2018/0175143 A1* | 6/2018 | Yoon | H01L 29/4236 |
| 2018/0226411 A1* | 8/2018 | Jung | H10B 12/482 |
| 2018/0350905 A1* | 12/2018 | Yoon | H01L 21/76232 |
| 2020/0135873 A1* | 4/2020 | Wu | H01L 29/785 |

\* cited by examiner

SEMICONDUCTOR DEVICE

CROSS-REFERENCE TO RELATED APPLICATION

This application claims priority under 35 U.S.C § 119 to Korean Patent Application No. 10-2019-0033841, filed on Mar. 25, 2019 in the Korean Intellectual Property Office, the disclosure of which is incorporated by reference in its entirety herein.

1. TECHNICAL FIELD

The present inventive concepts relate to a semiconductor device, and more particularly, to a semiconductor device with improved reliability.

2. DISCUSSION OF RELATED ART

A semiconductor device includes a plurality of transistors. The transistors integrated in the semiconductor device are formed to have various structures based on the required performances of the transistors, such as particular operating voltages and/or driving currents. For example, a complementary metal oxide semiconductor (CMOS) device has been developed that includes an NMOS transistor and a PMOS transistor having metal gate electrodes with different conductive types from each other. In addition, the CMOS device includes a gate dielectric layer that has a varying thickness depending on an applied voltage.

SUMMARY

Some exemplary embodiments of the present inventive concepts provide a semiconductor device with improved reliability.

According to some exemplary embodiments of the present inventive concepts, a semiconductor device may include a substrate having a first region and a second region. A device isolation layer is disposed in the substrate between the first region and the second region. The device isolation layer includes a buried dielectric layer in a trench that is recessed from a top surface of the substrate. A first liner layer is between the trench and the buried dielectric layer. A semiconductor layer is disposed on a top surface of the substrate of the first region. A first gate pattern is disposed on the semiconductor layer. A protrusion is disposed on a top surface of of the device isolation layer.

According to some exemplary embodiments of the present inventive concepts, a semiconductor device may include a substrate having a buried dielectric layer disposed in a trench that is recessed from a top surface of the substrate. The buried dielectric layer defines a first region and a second region of the substrate. A semiconductor layer is disposed on a top surface of the substrate of the first region. A first gate pattern is disposed on the semiconductor layer. The buried dielectric layer includes a first part adjacent to a first sidewall of the trench. A second part is adjacent to a second sidewall of the trench. The second sidewall faces the first sidewall. A third part is between the first part and the second part. Top surfaces of the first and second parts are recessed from the top surface of the substrate. A top surface of the third part is recessed from the top surfaces of the first and second parts.

According to some exemplary embodiments of the present inventive concepts, a semiconductor device may include a substrate having a cell array section and a peripheral circuit section. A first device isolation layer is disposed in the substrate of the cell array section and defines a plurality of cell regions on the cell array section of the substrate. A second device isolation layer is disposed in the substrate of the peripheral circuit section and defines a first gate region and a second gate region on the peripheral circuit section of the substrate. The second device isolation layer includes a buried dielectric layer in a trench recessed from a top surface of the substrate. A first liner layer is between the trench and the buried dielectric layer. A plurality plurality of cell gate lines extends across the cell regions in one direction. A semiconductor layer is disposed on a top surface of the substrate of the first gate region. A protrusion is disposed on a top surface of the second device isolation layer.

According to some exemplary embodiments of the present inventive concepts, a method for manufacturing a semiconductor device includes forming a substrate including a first region and a second region. A device isolation layer is formed in the substrate between the first region and the second region. The device isolation layer includes a buried dielectric layer in a trench recessed from a top surface of the substrate in the device isolation layer. A first liner layer is disposed between the trench and the buried dielectric layer in the device isolation layer. A semiconductor layer is formed on a top surface of the substrate of the first region. A first gate pattern is formed on the semiconductor layer. A protrusion is formed on a top surface of the device isolation layer.

DETAILED DESCRIPTION OF THE EXEMPLARY EMBODIMENTS

Figure 1:
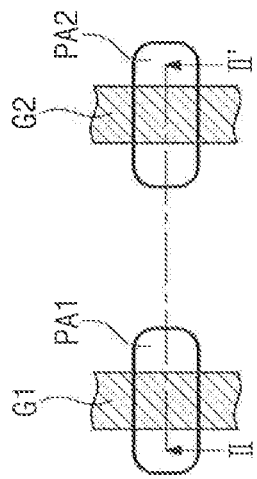
FIG. 1 illustrates a plan view showing a semiconductor device according to an exemplary embodiment of the present inventive concepts.
Figure 1:
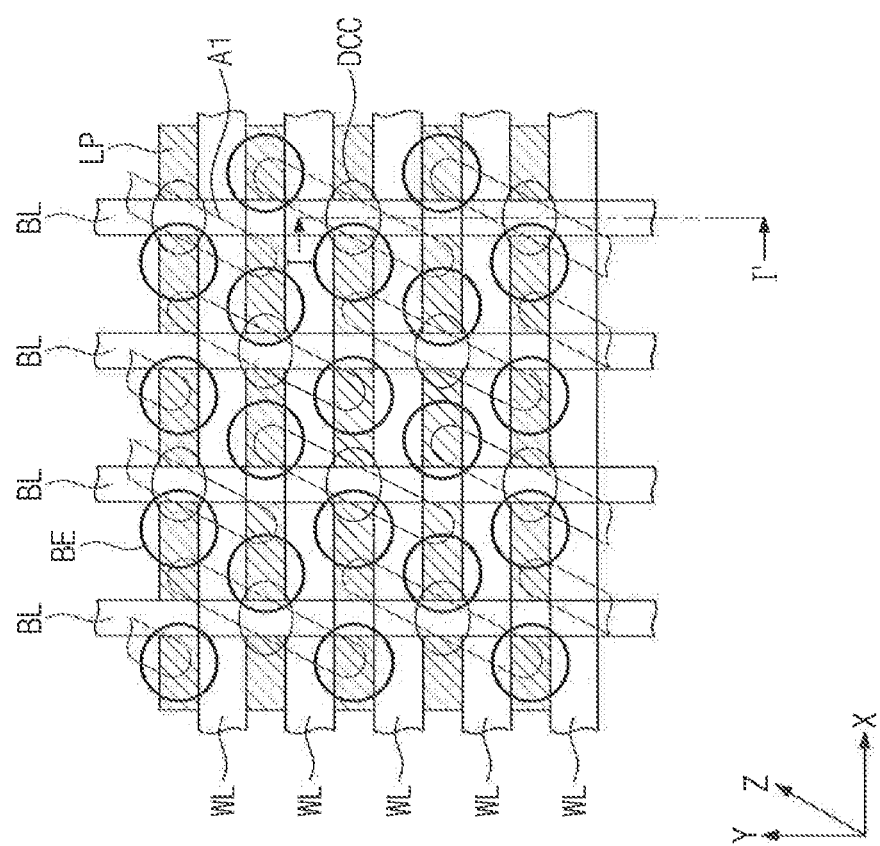
Figure 2:
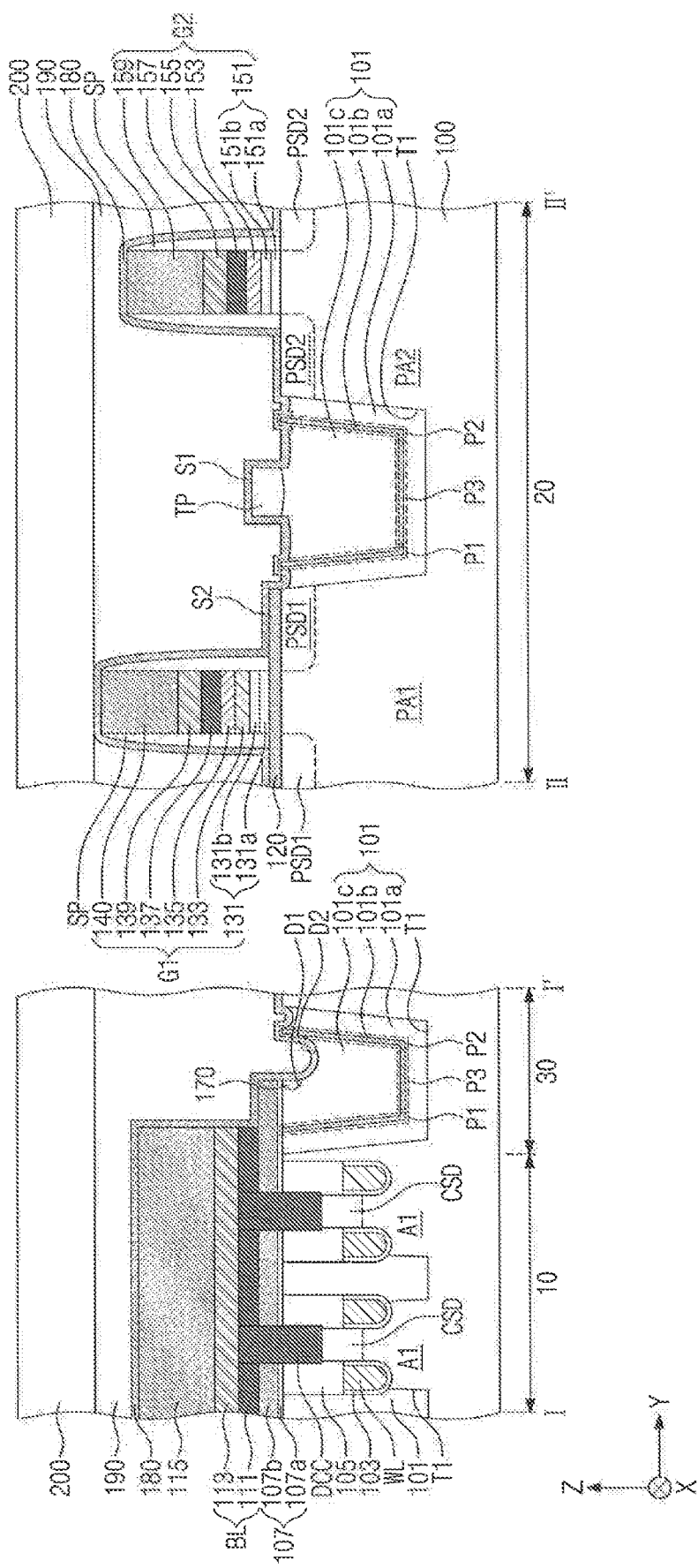
FIG. 2 illustrates a cross-sectional view taken along lines I-I' and II-II' of FIG. 1, showing a semiconductor device according to an exemplary embodiment of the present inventive concepts.

FIG. 1 illustrates a plan view showing a semiconductor device according to an exemplary embodiment of the present inventive concepts. FIG. 2 illustrates a cross-sectional view taken along lines I-I' and II-II' of FIG. 1, showing a semiconductor device according to an exemplary embodiment of the present inventive concepts.

Referring to FIGS. 1 and 2, a substrate 100 may include a cell array section 10, a peripheral circuit section 20, and an interface section 30 positioned between the cell array section 10 and the peripheral circuit section 20. The interface section 30 may be disposed adjacent to the cell array section 10 of the substrate 100. For example, the interface section 30 may be disposed adjacent to the cell array section 10 of the substrate in the second direction Y (the "Y direction") which intersects the first direction X (the "X direction") and the third direction Z (the "Z direction"). The peripheral circuit section 20 may be disposed adjacent to (e.g., in the Y direction) the interface section 30. In an exemplary embodiment, the substrate 100 may be a bulk silicon substrate, a silicon-on-insulator (SOI) substrate, a germanium substrate, a germanium-on-germanium-on-insulator (GOI) substrate, a silicon-germanium substrate, a III-V group compound semiconductor substrate, an epitaxial thin-film substrate obtained by performing selective epitaxial growth (SEG), etc. However, exemplary embodiments of the present inventive concepts are not limited thereto.

A device isolation layer 101 may be disposed in the substrate 100. The device isolation layer 101 may define a plurality of cell active regions A1 on the cell array section 10 of the substrate 100. The device isolation layer 101 may also define first and second peripheral circuit active regions PA1 and PA2 on the peripheral circuit section 20 of the substrate 100. The device isolation layer 101 may be disposed in a device isolation trench T1 that is recessed (e.g., in the Z direction) from a top surface of the substrate 100. The interface section 30 may be defined by the device isolation layer 101 disposed between the device isolation layer on the cell array section 10 of the substrate 100 and the device isolation layer on the peripheral circuit section 20 of the substrate 100. In an exemplary embodiment, the cell active regions A1 may each have a general bar shape that is elongated in a third direction Z, which is parallel to the thickness of the substrate 100. The cell active regions A1 may be parallel to each other in the third direction Z. The first and second peripheral circuit active regions PA1 and PA2 may be spaced apart from each other across the device isolation layer 101 on the peripheral circuit section 20 of the substrate 100. For example, the first and second peripheral circuit active regions PA1 and PA2 may be spaced apart in the Y direction. In an exemplary embodiment, the device isolation layer 101 may be a single body disposed on the cell array section 10, the peripheral circuit section 20 of the substrate 100, and the interface section 30 of the substrate 100.

In an exemplary embodiment, the device isolation layer 101 on the cell array section 10 of the substrate 100 may be formed of a single layer. For example, the device isolation layer 101 on the cell array section 10 of the substrate 100 may include a silicon oxide layer. However, exemplary embodiments of the present inventive concepts are not limited thereto. The device isolation layer 101 on the peripheral circuit section 20 and the interface section 30 of the substrate 100 may be formed of a plurality of layers. For example, the device isolation layer 101 on the peripheral circuit section 20 and the interface section 30 of the substrate 100 may include a first liner layer 101a, a second liner layer 101b, and a buried dielectric layer 101c. The buried dielectric layer 101c may be disposed within the device isolation trench T1. In an exemplary embodiment, the buried dielectric layer 101c may include a silicon oxide layer. However, exemplary embodiments of the present inventive concepts are not limited thereto.

The first liner layer 101a may be interposed between the buried dielectric layer 101c and a bottom surface (e.g., in the Z direction) of the device isolation trench T1, and may extend between the buried dielectric layer 101c and sidewalls of the device isolation trench T1. The first liner layer 101a may have a general "U" shape. In an exemplary embodiment, the first liner layer 101a may include a silicon oxide layer. However, exemplary embodiments of the present inventive concepts are not limited thereto. The second liner layer 101b may be disposed between the buried dielectric layer 101c and the first liner layer 101a. The second liner layer 101b may also have a general "U" shape and may be conformally disposed on the first liner layer. In an exemplary embodiment, the second liner layer 101b may include a silicon nitride layer or a silicon oxynitride layer. However, exemplary embodiments of the present inventive concepts are not limited thereto.

Cell source/drain regions CSD may be disposed in corresponding cell active regions A1. The cell source/drain regions CSD may each have a conductive type different from that of the substrate 100. For example, the cell source/drain regions CSD) may each have an N conductive type. Word lines WL may be disposed in the cell array section 10 of the substrate For example, two word lines WL may extend in a first direction X intersecting the third direction Z, running across one cell active region A1. The word lines WL may have their top surfaces at a lower level than that of the top surface of the substrate 100. For example, the word lines may be lower in the third direction Z than the level of a topmost surface of the substrate in the third direction. The word lines WL may be formed of a conductive material, such as an impurity-impurity-doped polysilicon, metal, or metal silicide. However, exemplary embodiments of the present inventive concepts are not limited thereto.

Gate dielectric layers 103 may be disposed on lower surfaces of the sidewalls and bottom surfaces of the word lines WL. In an exemplary embodiment, the gate dielectric layers 103 may include a silicon oxide layer, a thermal oxide layer, or a high-k dielectric layer. However, exemplary embodiments of the present inventive concepts are not limited thereto. Gate capping patterns 105 may be disposed on the top surfaces of the word lines WL and top surfaces of the gate dielectric layers 103. The gate capping patterns 105 may have their top surfaces (e.g., in the Z direction) at the same level as the top surface of the substrate 100. In an exemplary embodiment, the gate capping patterns 105 may include a dielectric material, such as a silicon oxide layer. However, exemplary embodiments of the present inventive concepts are not limited thereto.

A buffer layer 107 may be disposed on a top surface of the cell active region A1 of the substrate 100. For example, the buffer layer 107 may be disposed directly on, and may cover, the top surfaces of the gate capping patterns 105. The buffer layer 107 may extend to partially cover a top surface of the device isolation layer 101 on the interface section 30 of the substrate 100. For example, the device isolation layer 101 on the interface section 30 may be divided into a first segment adjacent (e.g., in the Y direction) to the cell array section 10 and a second segment adjacent (e.g., in the Y direction) to the peripheral circuit section 20. In this exemplary embodiment, the buffer layer 107 may extend to cover the top surface of the first segment and expose the top surface of the second segment. The buffer layer 107 may include a first buffer layer 107a and a second buffer layer 107b that are sequentially stacked on the top surface of the substrate 100. In an exemplary embodiment, the first and second buffer layers 107a and 107b may include different dielectric materials from each other. For example, the first buffer layer 107a may include a silicon oxide layer, and the second buffer layer 107b may include a silicon nitride layer. However, exemplary embodiments of the present inventive concepts are not limited thereto.

A bit line node contact DCC may be disposed on a central portion of each cell active region A1 between the two adjacent word lines WL. The bit line node contact DCC may be positioned between adjacent (e.g., in the Y direction) gate capping patterns. The bit line node contact DCC may penetrate the buffer layer 107 and be electrically connected with one cell source/drain region CSD disposed in each cell active region A1 between two adjacent word lines WL. The bit line node contact DCC may have a bottom surface at a level (e.g., in the Z direction) that is between the top surface of the substrate 100 and the top surfaces of the word lines WL. In an exemplary embodiment, the bit line node contact DCC may include impurity-doped polysilicon. However, exemplary embodiments of the present inventive concepts are not limited thereto.

Bit lines BL may extend in the second direction Y. Each of the bit lines BL may cross over a plurality of bit line node contacts DCC arranged in the second direction Y. A single bit line BL, may be electrically connected to a plurality of bit line node contacts DCC arranged in the second direction Y. Each of the bit lines BL may include a cell conductive pattern 111 and a cell metal pattern 113 that are sequentially stacked (e.g., in the Z direction) on the buffer layer 107. The cell conductive pattern 111 may cover sidewalls of the bit line node contacts DCC arranged in the second direction Y on a top surface of the buffer layer 107. The cell conductive pattern 111 may have a top surface at the same level (e.g., in the Z direction) as the bit line node contacts DCC. In an exemplary embodiment, the cell conductive pattern 111 may include doped polysilicon, tungsten, molybdenum, gold, copper, aluminum, nickel, or cobalt. However, exemplary embodiments of the present inventive concepts are not limited thereto. The cell metal pattern 113 may be disposed on the top surface of the cell conductive pattern 111. In an exemplary embodiment, the cell metal pattern 113 may include one or more of TiSiN, TiN, TaN, metal, and metal silicide. The metal and the metal silicide may include, for example, tungsten, molybdenum, gold, copper, aluminum, nickel, or cobalt. However, exemplary embodiments of the present inventive concepts are not limited thereto. First capping patterns 115 may be disposed on the bit lines BL. The first capping patterns 115 may cover top surfaces (e.g., in the Z direction) of the bit lines BL. In an exemplary embodiment, the first capping patterns 115 may include a dielectric material, such as a silicon nitride layer or a silicon oxynitride layer. However, exemplary embodiments of the present inventive concepts are not limited thereto.

Storage node contacts may be disposed in distal ends of the cell active regions A1. The storage node contacts may be electrically connected to the cell source/drain regions CSD disposed in the distal ends of the cell active regions A1. The storage node contacts may include, for example, impurity-doped polysilicon. Landing pads LP may be disposed on the storage node contacts. The landing pads LP may be electrically connected to the storage node contacts. The landing pads LP may include one or more of a metal layer and a metal nitride layer. In an exemplary embodiment, the metal layer may include tungsten. For example, the metal nitride layer may include TiN, Ti/TiN, TiSiN, TaN, or WN. However, exemplary embodiments of the present inventive concepts are not limited thereto.

The data storage elements may be disposed on the landing pads LP. For example, the data storage elements may be capacitors. Each of the capacitors may include a bottom electrode BE, a dielectric layer, and a top electrode. For example, a plurality of bottom electrodes BE may be arranged in a zigzag fashion along the second direction Y.

A semiconductor layer 120 may be disposed on the top surface of the substrate 100 of the first peripheral circuit active region PA1. The semiconductor layer 120 may be locally placed on the top surface of the substrate 100 of the first peripheral circuit active region PA1. The semiconductor layer 120 may have a lattice constant that is greater than the lattice constant of the substrate 100. For example, the semiconductor layer 120 may include silicon-germanium. However, exemplary embodiments of the present inventive concepts are not limited thereto. The semiconductor layer 120 may reduce a work function. Further, the semiconductor layer 120 may increase the hole mobility of a PMOS transistor. For example, in an exemplary embodiment, the first peripheral circuit active region PA1 may be a PMOS region.

A first gate pattern G1 may be disposed on a top surface S2 of the semiconductor layer 120. The first gate pattern G1 may include a first gate dielectric pattern 131, a first conductive type metal pattern 133, a second conductive type metal pattern 135, a first conductive pattern 137, a first metal pattern 139, and a second capping pattern 140 that are sequentially stacked (e.g., in the Z direction) on the top surface S2 of the semiconductor layer 120. The first gate dielectric pattern 131 may include a first oxidation pattern 131a and a first dielectric pattern 131b that are sequentially stacked on the top surface S2 of the semiconductor layer 120. In an exemplary embodiment, the first oxidation pattern 131a may include a silicon oxide layer or a thermal oxide layer. However, exemplary embodiments are not limited thereto. In an exemplary exemplary embodiment, the first dielectric pattern 131b may include $HfO_2$, $Al_2O_3$, $HfAlO_3$, $Ta_2O_3$, or $TiO_2$. However, exemplar) embodiments are not limited thereto. The first conductive type metal pattern 133 may be a metal layer that controls a threshold voltage $V_{th}$ of a P-type gate electrode. For example, the first conductive type metal pattern 133 may include one or more of an aluminum layer, an aluminum oxide layer, a titanium nitride layer, a tungsten nitride layer, and a ruthenium oxide layer. For example, the first conductive type metal pattern 133 may include an aluminum oxide layer and a titanium nitride layer that are sequentially stacked. However, exemplary embodiments are not limited thereto.

The second conductive type metal pattern 135 may be a metal layer that controls a threshold voltage $V_{th}$ of an N-type gate electrode. In an exemplary embodiment, the second conductive type metal pattern 135 may include one or more of a lanthanum layer, a lanthanum oxide layer, a tantalum layer, a tantalum nitride layer, a niobium layer, and a titanium nitride layer. However, exemplary embodiments of the present inventive concepts are not limited thereto.

The first conductive pattern 137 may include the same material as the material of the cell conductive pattern 111 of the bit line BL. For example, the first conductive pattern 137 may include doped polysilicon, tungsten, molybdenum, gold, copper, aluminum, nickel, or cobalt. The first metal pattern 139 may be formed of the same material as that of the cell metal pattern 113 of the bit line BL. For example, the first metal pattern 139 may include one or more of TiSiN, TiN. TaN, metal, and metal silicide. The metal and the metal silicide may include, for example, tungsten, molybdenum, gold, copper, aluminum, nickel, or cobalt. The second capping pattern 140 may be disposed on a top surface of the first metal pattern 139. The second capping pattern 140 may include the same material as the material of the first capping pattern 115. For example, the second capping pattern 140 may include a silicon oxynitride layer or a silicon nitride layer.

First peripheral source/drain regions PSD1 may be disposed in the substrate 100 on opposite sides (e.g., in the Y direction) of the first gate pattern G1 on the first peripheral circuit active region PA1. The first peripheral source/drain regions PSD1 may be doped with, for example, P-type impurities.

A second gate pattern G2 may be disposed on the top surface of the substrate 100 of the second peripheral circuit active region PA2. For example, the second peripheral circuit active region PA2 may be an NMOS region. However, in other exemplary embodiments, the second gate pattern G2 may be a PMOS region and the first gate pattern G1 may be an NMOS region. The second gate pattern G2 may include a second gate dielectric pattern 151, a second conductive type metal pattern 153, a second conductive pattern 155, a second metal pattern 157, and a third capping pattern 159. The second gate dielectric pattern 151 may include a second oxidation pattern 151a and a second dielectric pattern 151b that are sequentially stacked on the top surface of the substrate 100. The second oxidation pattern 151a may include, for example, a silicon oxide layer or a thermal oxide layer. The second dielectric pattern 151b may include, for example, $HfO_2$, $Al_2O_3$, $HfAlO_3$, $Ta_2O_3$, or $TiO_2$. The second conductive type metal pattern 153 may be a metal layer that controls a threshold voltage $V_{th}$ of an N-type gate electrode. In an exemplary embodiment, the second conductive type metal pattern 153 may include one or more of a lanthanum layer, a lanthanum oxide layer, a tantalum layer, a tantalum nitride layer, a niobium layer, and a titanium nitride layer. However, exemplary embodiments of the present inventive concepts are not limited thereto.

The second conductive pattern 155 may include the same material as the material of the first conductive pattern 137. The second metal pattern 157 may include the same material as as the material of the first metal pattern 139. The third capping pattern 159 may include the same material as the material of the second capping pattern 140. Second peripheral source/drain regions PSD2 may be disposed in the substrate 100 on opposite sides (e.g., in the Y direction) of the second gate pattern G2 on the second peripheral circuit active region PA2. The second peripheral source/drain regions PSD2 may be doped with, for example, N-type impurities.

Spacers SP may be disposed on the sidewalls of the first gate pattern G1 and the sidewalls of the second gate pattern G2. The spacers SP covering the sidewalls of the first gate pattern G1 may be disposed on the top surface S2 of the semiconductor layer 120 of the first peripheral circuit active region PA1 and may extend (e.g., in the Z direction) to cover the sidewalls of the first gate pattern. The spacers SP covering the sidewalls of the second gate pattern G2 may be disposed on the top surface of the substrate 100 of the second peripheral circuit active region PA2 and may extend (e.g., in the Z direction) to cover the sidewalls of the second gate pattern. The spacers SP may expose (e.g., may not cover) top surfaces of the second and third capping patterns 140 and 159. The spacers SP may include a dielectric material of single or multiple layers. For example, the spacers SP may include one or more of a silicon oxide layer, a silicon nitride layer, or a silicon oxynitride layer. However, exemplary embodiments of the present inventive concepts are not limited thereto.

The first liner layer 101a of the device isolation layer 101 positioned between the first and second peripheral circuit active regions PA1 and PA2 may have a top surface that is recessed from the top surface of the substrate 100. For example, the top surface of the first liner layer 101a may be located at a lower level (e.g., in the Z direction) than the top surface of the substrate 100. In an exemplary embodiment, the top surface of the first liner layer 101a may have a concavely curved surface.

A protrusion TP may be disposed on the top surface of the device isolation layer 101 on the peripheral circuit section 20. In some exemplary embodiments, the protrusion TP may be disposed directly on a top surface of the buried dielectric layer 101c. For example, as shown in FIG. 2, the protrusion TP may directly contact the top surface of the buried dielectric layer 101c. The protrusion TP may be positioned on a center portion (e.g., in the Y direction) of the top surface of the buried dielectric layer 101c. The protrusion TP may have a flat top surface S1. For example, the protrusion TP may generally extend in the Y direction, parallel to the extending surface of the substrate 100. The top surface S2 of the semiconductor layer 120 may be located at a lower level (e.g., in the Z direction) from the top surface of the substrate 100 than the top surface S1 of the protrusion TP. The top surface S1 of the protrusion TP may be located at a higher level from the top surface of the substrate 100 than the top surface of the device isolation layer 101 on the cell array section 10 of the substrate 100. The top surface of the buried dielectric layer 101c on the peripheral circuit section 20 which is exposed by the protrusion TP may be located at a lower level (e.g., in the Z direction) than the top surface of the device isolation layer 101 on the cell array section 10 of the substrate 100. The exposed top surface of the buried dielectric layer 101c on the peripheral circuit section 20 may be recessed from the top surface of the substrate 100 and/or from a top surface of the second liner layer 101b. The top surface of the buried dielectric layer 101c on the peripheral circuit section 20 may be located at a lower level than that of the top surface of the substrate 100. The top surface of the buried dielectric layer 101c on the peripheral circuit section 20 below the protrusion TP may have a concavely curved surface. In certain exemplary embodiments, the protrusion TP may be spaced apart from the first and second liner layers 101a and 101b. The protrusion TP may be spaced apart from the semiconductor layer 120 and the top surface of the substrate 100. For example, the protrusion TP may be locally disposed on the top surface of the buried dielectric layer 101c. The protrusion TP may include the same material as that of the buried dielectric layer 101c. For example, the protrusion TP may include a silicon oxide layer. However, exemplary embodiments of the present inventive concepts are not limited thereto.

The second liner layer 101b may include first and second vertical segments P1 and P2 extending along the sidewalls of the first liner layer 101a to a bottom surface of the first liner layer. The second liner layer 101b may also include a horizontal segment P3 that is positioned between bottom ends of the first and second vertical segments P1 and P2 and connects the first and second vertical segments to each other. The horizontal segment P3 may be disposed on a bottom portion of the first liner layer 101a. The first and second vertical segments P1 and P2 may have their upper portions exposed by (e.g., not covered by) the first liner layer 101a and the buried dielectric layer 101c. For example, top surfaces and upper sidewalls of the first and second vertical segments P1 and P2 may extend higher than top portions of the first liner layer 101a and the buried dielectric layer 101c.

The buried dielectric layer 101c of the device isolation layer 101 on the interface section 30 of the substrate 100 may have a first dent D1 and a second dent D2 that are recessed from the top surface of the substrate 100. The first dent D1 may be formed when the top surface of the buried dielectric layer 101c exposed by the buffer layer 107 is recessed. The first dent D1 may be a concave surface that extends laterally (e.g., in the Y direction) toward the cell array section 10. For example, the first dent D1 may have a concave bottom surface. The second dent D2 may be a concave surface that extends from a portion of the concave surface of the first dent D1 toward the bottom surface of the device isolation trench T1 (e.g., in the Z direction). A residual pattern 170 may be disposed in the first dent D1. In an exemplary embodiment, the residual pattern 170 may include the same material as the material of the protrusion TP. In certain exemplary embodiments, the residual pattern 170 may have a sidewall that is aligned with the buffer layer 107 disposed on the interface section 30 of the substrate 100. For example, a top portion of the sidewall of the residual pattern 170 may be positioned at the same level (e.g., in the Z direction) as the buffer layer 107 disposed on the interface section 30 of the substrate 100.

On the interface section 30 of the substrate 100, the first liner layer 101a adjacent to the peripheral circuit section 20 may have a top surface that is recessed (e.g., in the Z direction) from the top surface of the substrate 100. The first liner layer 101a adjacent to the cell array section 10 may have a flat top surface which generally extends in the Y direction. The buffer layer 107 may cover the top surface of the first liner layer 101a adjacent to the cell array section 10. The recessed surface of the top surface of the first liner layer 101a adjacent to the peripheral circuit section 20 may be a concavely curved surface. In certain exemplary embodiments, the top surface of the first liner layer 101a adjacent to the cell array section 10 and adjacent to the peripheral circuit section 20 may be located at a higher level than that of a bottom surface of the second dent D2. On the interface section 30 of the substrate 100, the second liner layer 101b may have an upper portion exposed by the first liner layer 101a and the buried dielectric layer 101c. For example, the top surface of the first liner layer 101a and the top surface of the buried dielectric layer 101c may extend lower (in the Z direction) than the top surface of the second liner layer 101b and may expose the top surface and upper sidewalls of the second vertical segment P2 of the second liner layer on the interface section 30 of the substrate 100. The buffer layer 107 may cover the top surface of the first vertical segment P1 of the second liner layer 101b on the interface section 30 of the substrate 100.

An etch stop layer 180 may be disposed on the cell array section 10, the peripheral circuit section 20, and the interface section 30 of the substrate 100. For example, the etch stop layer 180 may conformally cover top surfaces and sidewalls of the first capping patterns 115, sidewalls of the bit lines BL, the top surface and sidewalls of the buffer layer 107 exposed by the bit lines BL, the sidewall of the residual pattern 170 exposed by the buffer layer 107, the bottom surface of the second dent D2, the top surface and upper sidewalls of the second vertical segment P2 of the second liner layer 101b in the substrate 100 of the interface section 30, the top surface of the first liner layer 101a, the top surface of the substrate 100 of the interface section 30, the top surface S2 and sidewall of the semiconductor layer 120 exposed by the first gate pattern G1, sidewalls of the spacers SP, the top surface of the second capping pattern 140, a top surface of the second peripheral circuit active region PA2 exposed by the second gate pattern G2, the top surface of the third capping pattern 159, the top surface of the first liner layer 101a, the top surface and sidewalls of the first and second vertical segments P1 and P2 of the second liner layer 101b, the top surface of the buried dielectric layer 101c, and the top surface S1 and sidewalls of the protrusion TP. In an exemplary embodiment, the etch stop layer 180 may include a silicon nitride layer or a silicon oxynitride layer. However, exemplary embodiments of of the present inventive concepts are not limited thereto.

A first interlayer dielectric layer 190 may be disposed on the etch stop layer 180. The first interlayer dielectric layer 190 may cover a top surface of the etch stop layer 180. The first interlayer dielectric layer 190 may have a top surface at substantially the same level as that of an uppermost portion (e.g., in the Z direction) of the top surface of the etch stop layer 180. For example, the first interlayer dielectric layer 190 may expose (e.g., not cover) the top surface of the etch stop layer 180 that covers the top surface of the second capping pattern 140. The first interlayer dielectric layer 190 may cover the top surface of the etch stop layer 180 that covers the top surface of the third capping pattern 159, the top surface of the etch stop layer 180 disposed on the interface section 30 of the substrate 100, and the top surface of the etch stop layer 180 covering the top surface of the first capping pattern 115 in the cell array section 10. In an exemplary embodiment, the first interlayer dielectric layer 190 may include a dielectric layer, such as a silicon oxide layer, a silicon nitride layer, or a silicon oxynitride layer. However, exemplary embodiments of the present inventive concepts are not limited thereto.

A second interlayer dielectric layer 200 may be disposed on the top surface of the first interlayer dielectric layer 190. The second interlayer dielectric layer 200 may include a dielectric layer. In an exemplary embodiment, the second interlayer dielectric layer 200 may include a silicon oxide layer, a silicon nitride layer or a silicon oxynitride layer. However, exemplary embodiments of the present inventive concepts are not limited thereto.

Figure 3:
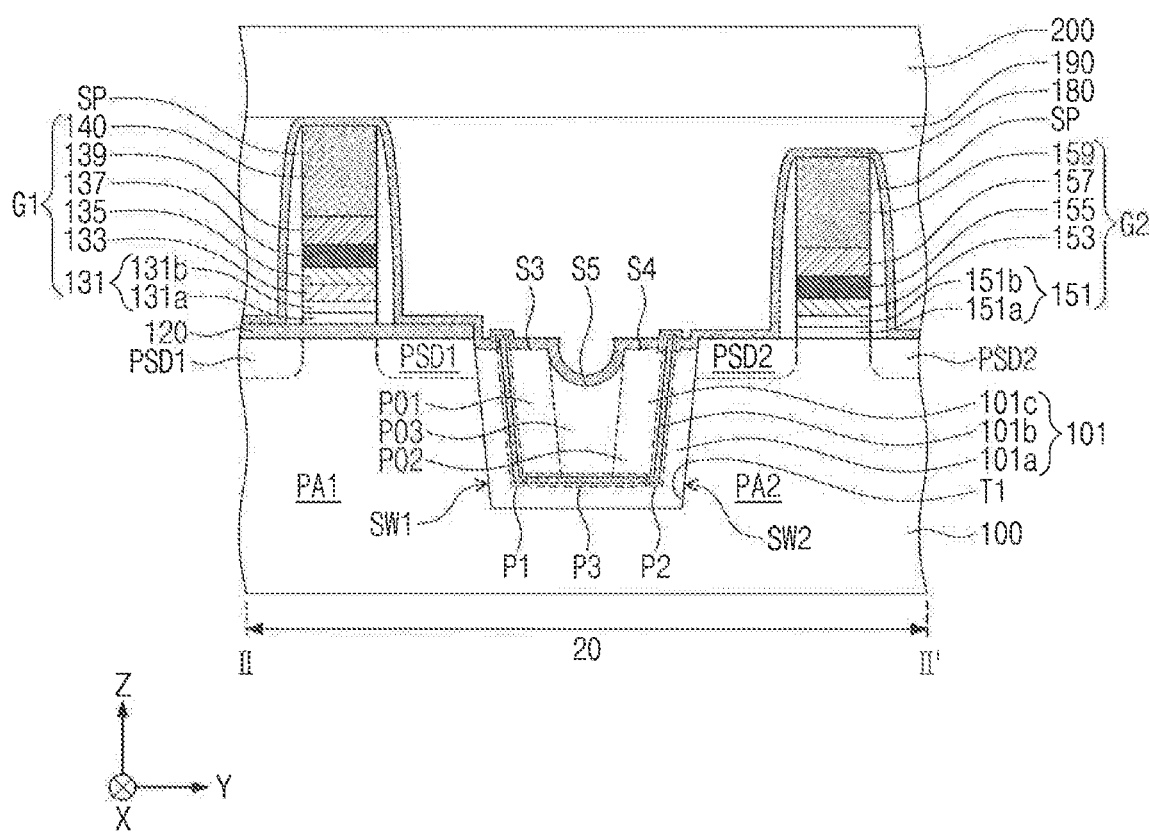
FIG. 3 illustrates a cross-sectional view taken along line II-II' of FIG. 1, showing a semiconductor device according to an exemplary embodiment of the present inventive concepts.

FIG. 3 illustrates a cross-sectional view taken along line II-II' of FIG. 1, showing a semiconductor device according to an exemplary embodiment of the present inventive concepts. The previous descriptions regarding the construction and configuration of the cell array section 10 and the interface section 30 are also applicable to the exemplary embodiment shown in FIG. 3. Therefore, redundant descriptions and drawings thereof with respect to the following exemplary embodiment will be omitted.

Referring to FIG. 3, the buried dielectric layer 101c in the substrate 100 of the peripheral circuit section 20 may include a first part P01, a second part P02, and a third part P03. The device isolation trench T1 may have a first sidewall SW1 adjacent to the first peripheral circuit active region PA1 and a second sidewall SW2 adjacent to the second peripheral circuit active region PA2. The first part P01 of the buried dielectric layer 101c may be adjacent to the first sidewall SW1, the second part P02 of the buried dielectric layer may be adjacent to the second sidewall SW2, and the third part P03 of the buried dielectric layer may be positioned between the first part P01 and the second part P02. For example, the first part P01 and the second part P02 of the buried dielectric layer may be spaced apart in the Y direction and the third part P03 may be positioned therebetween. The first part P01 may be adjacent to the first vertical vertical segment P1 of the second liner layer 101b, and the second part P02 may be adjacent to the second vertical segment P2 of the second liner layer 101b. The top surface of the buried dielectric layer 101c may be recessed (e.g., in the Z direction) from the top surface of the substrate 100 and/or from the top surface of the second liner layer 101b. A top surface S3 of the first part P01 and a top surface S4 of the second part P02 may be recessed from the top surface of the substrate 100 and/or from the top surface of the second liner layer 101b. A top surface S5 of the third part P03 may be recessed (e.g., in the Z direction) from the top surfaces S3 and S4 of the first and second parts P01 and P02. The top surfaces S3 and S4 of the first and second parts P01 and P02 may be located at a higher level (e.g., in the Z direction) than the top surface S5 of the third part P03. For example, the top surfaces S3 and S4 of the first and second parts P01 and P02 may be closer to the top surface of the substrate 100 than the top surface S5 of the third part P03. The recessed top surfaces S3, S4, and S5 of the first, second, and third parts P01, P02, and P03 may each be concavely curved surfaces. In certain exemplary embodiments, the top surface S5 of the third part P03 may have a radius of curvature that is less than the radius of curvature of the top surfaces S3 and S4 of the first and second parts P01 and P02. The top surface of the device isolation layer 101 may not include a protrusion PT in this embodiment.

Figure 4:
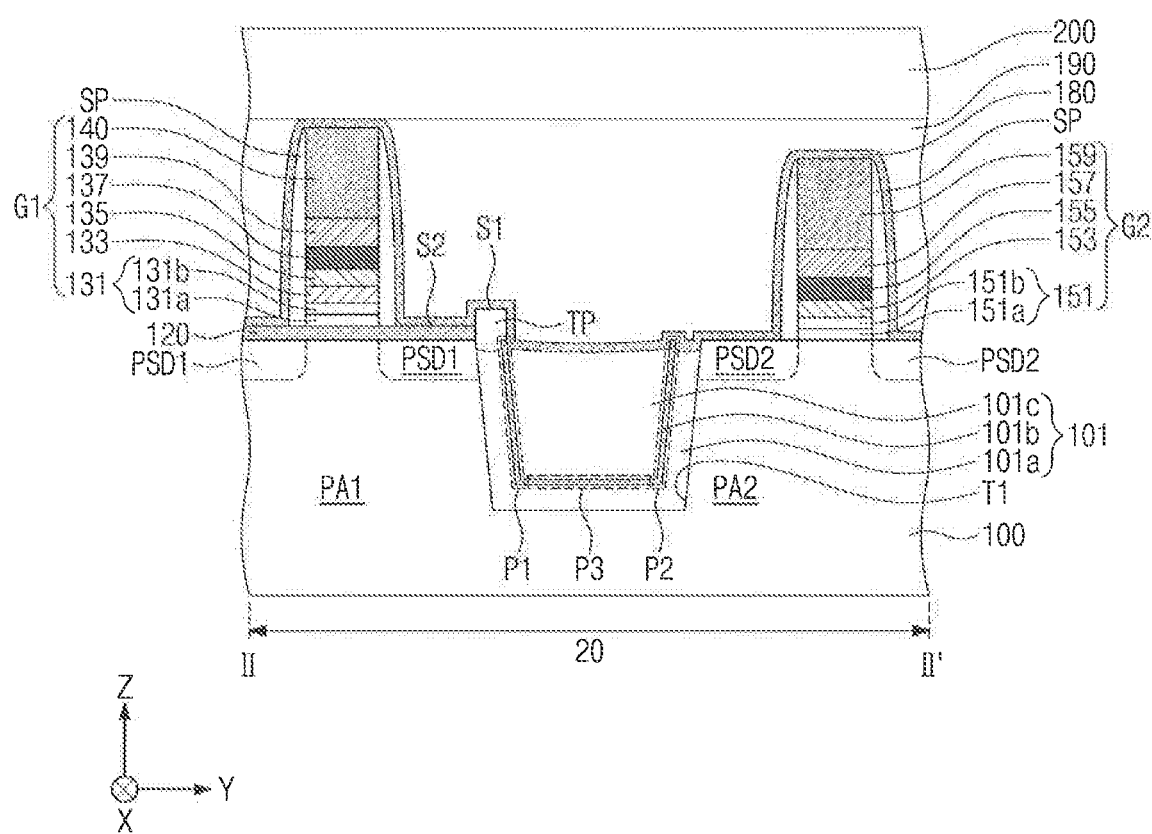
FIG. 4 illustrates a cross-sectional view taken along line II-II' of FIG. 1, showing a semiconductor device according to an exemplary embodiment of the present inventive concepts.

FIG. 4 illustrates a cross-sectional view taken along line II-II' of FIG. 1, showing a semiconductor device according to an exemplary embodiment of the present inventive concepts.

Referring to FIG. 4, the protrusion TP may be disposed on the top surface of the device isolation layer 101 in the substrate 100 of the peripheral circuit section 20. For example, the protrusion TP may be disposed on the top surface of the first vertical segment P1 and on the top surface of the first liner layer 101a adjacent to the first peripheral circuit active region PA1. As shown in FIG. 4, the protrusion TP may be physically spaced apart from the top surface of the buried dielectric layer 101c (e.g., in the Y and/or Z directions). For example, the top surface of the buried dielectric layer 101c may be exposed (e.g., not covered) by the protrusion TP. However, in other exemplary embodiments, the protrusion TP may be disposed on the top surface of the first liner layer 101a adjacent to the first peripheral circuit active region PA1, the top surface of the first vertical segment P1, and a portion of the top surface of the buried dielectric layer 101c. In this embodiment, the protrusion TP may be physically spaced apart from the top surface of the first liner layer 101a adjacent to the second peripheral circuit active region PA2 and from the top surface of the second vertical segment P2. The protrusion TP may directly contact the sidewall of the semiconductor layer 120. The top surface S1 of the protrusion TP may be located at a higher level (e.g., in the Z direction) from the top surface of the substrate 100 than the top surface S2 of the semiconductor layer 120. In an exemplary embodiment, the protrusion TP may include the same material as the material of the first liner layer 101a.

Figure 5:
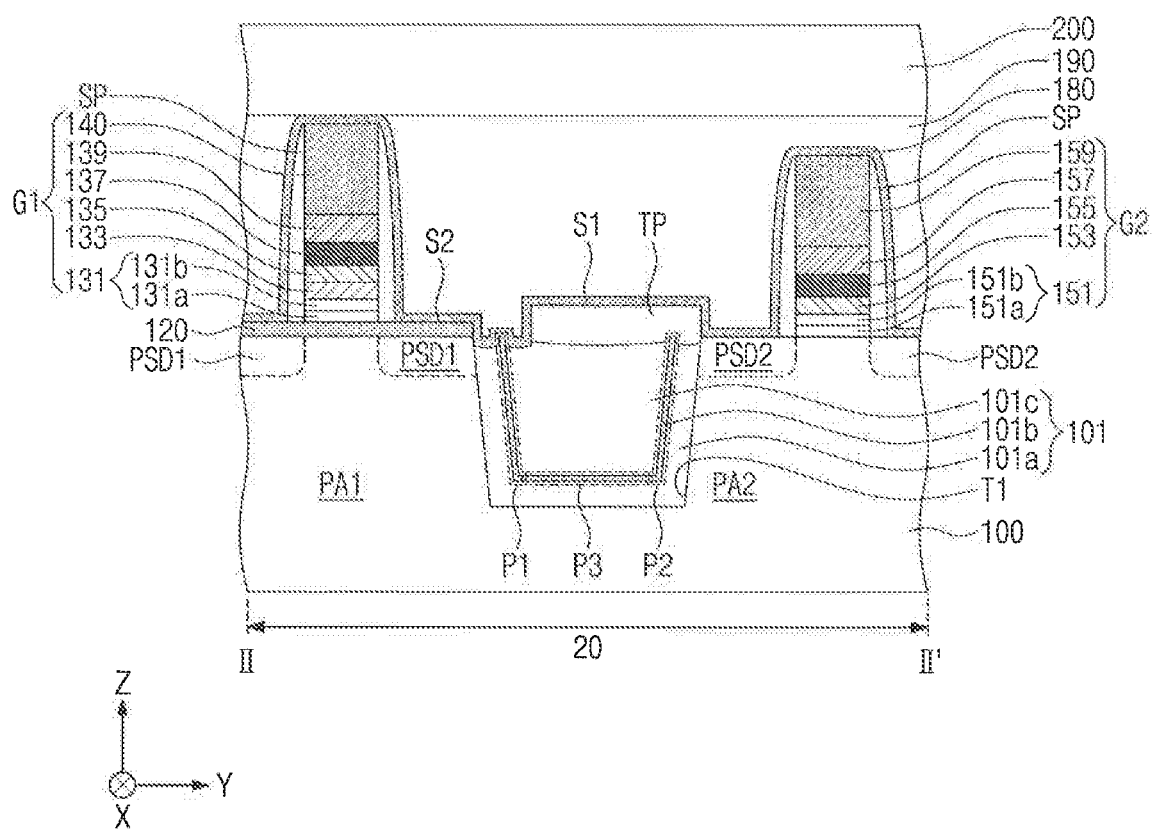
FIG. 5 illustrates a cross-sectional view taken along line II-II' of FIG. 1, showing a semiconductor device according to an exemplary embodiment of the present inventive concepts.
Figure 6:
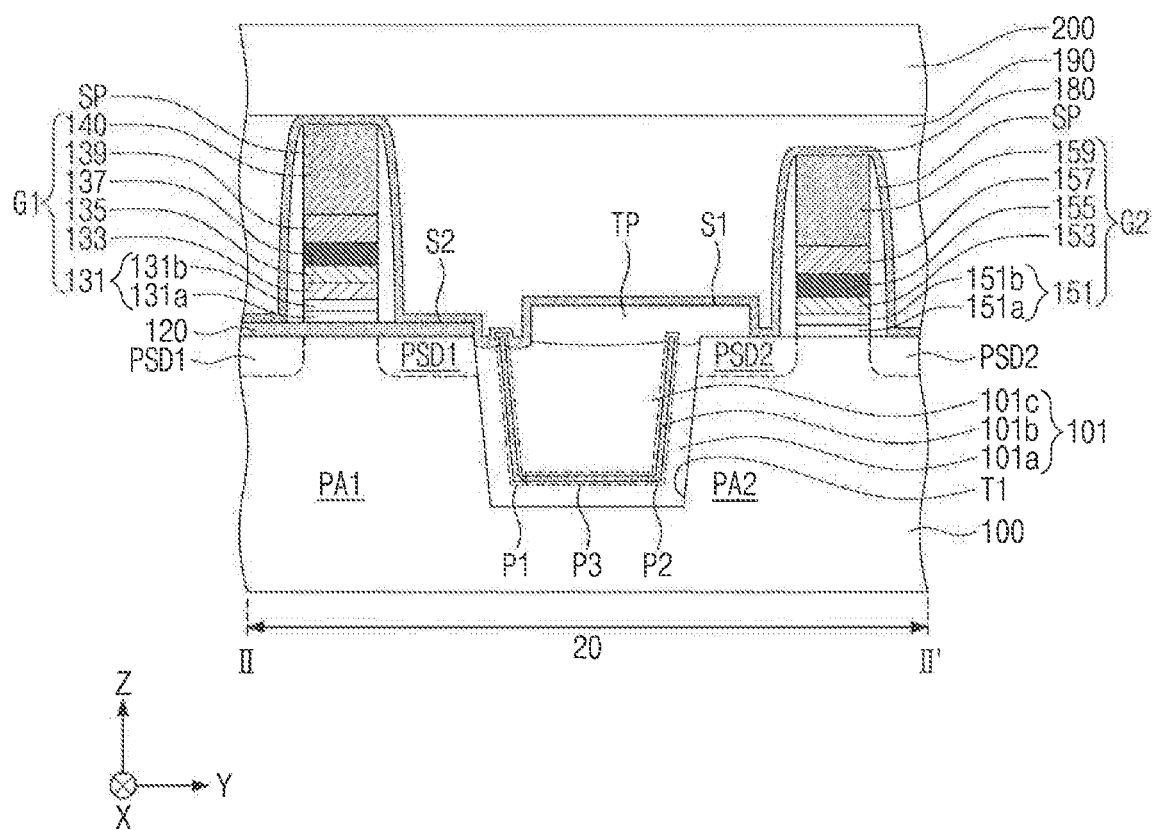
FIG. 6 illustrates a cross-sectional view taken along line II-II' of FIG. 1, showing a semiconductor device according to an exemplary embodiment of the present inventive concepts.

FIG. 5 illustrates a cross-sectional view taken along line II-II' of FIG. 1, showing a semiconductor device according to an exemplary embodiment of the present inventive concepts. FIG. 6 illustrates a cross-sectional view taken along line II-II' of FIG. 1, showing a semiconductor device according to an exemplary embodiment of the present inventive concepts.

Referring to FIGS. 5 and 6, the protrusion TP may be disposed on the top surface of the device isolation layer 101 in the substrate 100 of the peripheral circuit section 20. The protrusion TP may be disposed on a portion of the top surface of the buried dielectric layer 101c, the top surface of the second vertical segment P2, and the top surface of the first liner layer 101a adjacent to the second peripheral circuit active region PA2. The protrusion TP may expose (e.g., not cover) the top surface of the first liner layer 101a adjacent to the first peripheral circuit active region PA1 and the top surface of the first vertical segment P1. For example, the protrusion TP may be physically spaced apart (e.g., in the Y and/or Z directions) from the top surface of the first liner layer 101a adjacent to the first peripheral circuit active region PA and from the top surface of the first vertical segment P1. The top surface of the buried dielectric layer 101c and the top surface of the first liner layer 101a adjacent to the first peripheral circuit active region PA1 may be recessed (e.g., in the Z direction) from the top surface of the substrate 100 and/or from the top surface of the first vertical segment P1. The protrusion TP may be spaced apart from the semiconductor layer 120.

In certain exemplary embodiments, as shown in FIG. 5, the protrusion TP may not be disposed on the top surface of the second peripheral circuit active region PA2. For example, the protrusion TP may expose the top surface of the substrate 100 which reveals the second peripheral source/drain region PSD2 adjacent to the device isolation layer 101. However, in the exemplary embodiment of FIG. 6, the protrusion TP may extend onto the top surface of the substrate 100 of the second peripheral circuit active region PA2 and be disposed above at least a portion of the second peripheral source/drain region PSD2. The protrusion TP may directly contact or be spaced apart from the spacer SP covering the sidewall of the second gate pattern G2. The protrusion TP may directly contact the top surface of the substrate 100 of the second peripheral circuit active region PA2 adjacent to the device isolation layer 101 on the peripheral circuit section 20.

Figure 7:
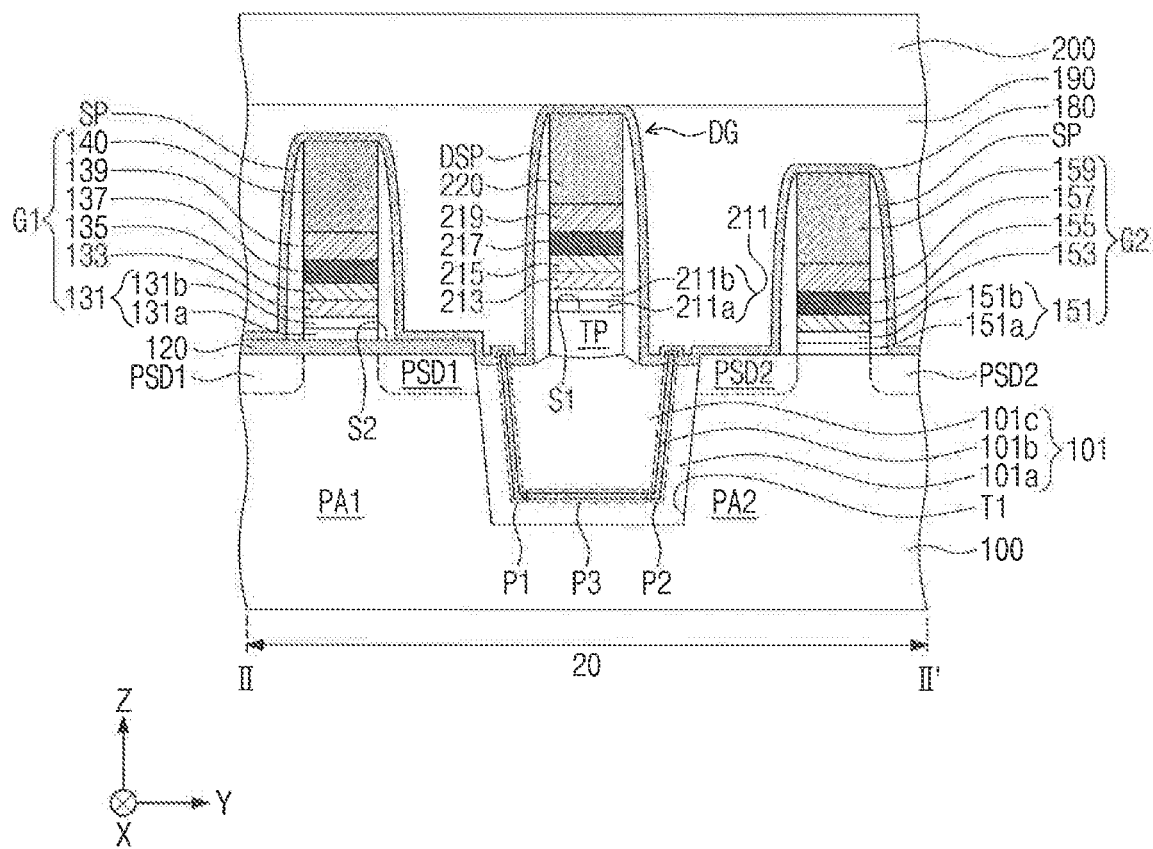
FIG. 7 illustrates a cross-sectional view taken along line II-II' of FIG. 1, showing a semiconductor device according to an exemplary embodiment of the present inventive concepts.

FIG. 7 illustrates a cross-sectional view taken along line II-II' of FIG. 1, showing a semiconductor device according to an exemplary embodiment of the present inventive concepts.

Referring to FIG. 7, the protrusion TP may be disposed on the buried dielectric layer 101c. For example, the protrusion TP may be disposed on a central portion (e.g., in the Y direction) of a top surface of the buried dielectric layer 101c. The protrusion TP may directly contact with the top surface of the buried dielectric layer 101c. A dummy gate pattern DG may be disposed on the top surface S1 of the protrusion TP. The dummy gate pattern DG may include a dummy gate dielectric pattern 211, a dummy first conductive type metal pattern 213, a dummy second conductive type metal pattern 215, a dummy conductive pattern 217, a dummy metal pattern 219, and a dummy capping pattern 220. The dummy gate dielectric pattern 211 may include a dummy oxidation pattern 211a and a dummy dielectric pattern 211b that are sequentially stacked (e.g., in the Z direction) on the top surface S of the protrusion TP. In an exemplary embodiment, the dummy oxidation pattern 211a may include the same material as the first and second oxidation patterns 131a and 151a of the first gate pattern G1 and second gate pattern G2, respectively. The dummy dielectric pattern 211b may include the same material as the material of the first and second dielectric patterns 131b and 151b of the first gate pattern G1 and second gate pattern G2, respectively. The dummy first conductive type metal pattern 213 may include the same material as the material of the first conductive type metal pattern 133 of the first gate pattern G1. The dummy second conductive type metal pattern 215 may include the the same material as that of the second conductive type metal patterns 135 and 153 of the first gate pattern G1 and second gate pattern G2, respectively. The dummy conductive pattern 217 may include the same material as the material of the first and second conductive patterns 137 and 155 of the first gate pattern G1 and second gate pattern (G2, respectively. The dummy metal pattern 219 may include the same material as the material of the first and second metal patterns 139 and 157 of the first gate pattern G1 and second gate pattern G2, respectively. The dummy capping pattern 220 may include the same material as the material of the second and third capping patterns 140 and 159 of the first gate pattern G1 and second gate pattern G2, respectively. Dummy spacers DSP may be disposed on sidewalls of the dummy gate pattern DG, the sidewalls of the protrusion TP and a top surface of the buried dielectric layer 101c. The dummy spacers DSP may cover the sidewalls of the dummy gate pattern DG, the sidewalls of the protrusion TP and a top surface of the buried dielectric layer 101c adjacent to the dummy gate pattern. In an exemplary embodiment, the dummy spacers DSP may include the same material as the spacers SP.

The etch stop layer 180 may conformally cover a top surface of the dummy gate pattern DG and sidewalls of the dummy spacers DSP. In certain exemplary embodiments, the top surface of the dummy gate pattern DG may be located at a higher level (e.g., in the Z direction) from the top surface of the substrate 100 than the top surfaces of the first and second gate patterns G1 and G2. In certain exemplary embodiments, the dummy second conductive type metal pattern 215 of the dummy gate pattern DG may have a top surface at a higher level (e.g., in the Z direction) from the top surface of the substrate 100 than the top surface of the second conductive type metal pattern 135 of the first gate pattern G1 and the top surface of the second conductive type metal pattern 153 of the second gate pattern G2.

Figure 8:
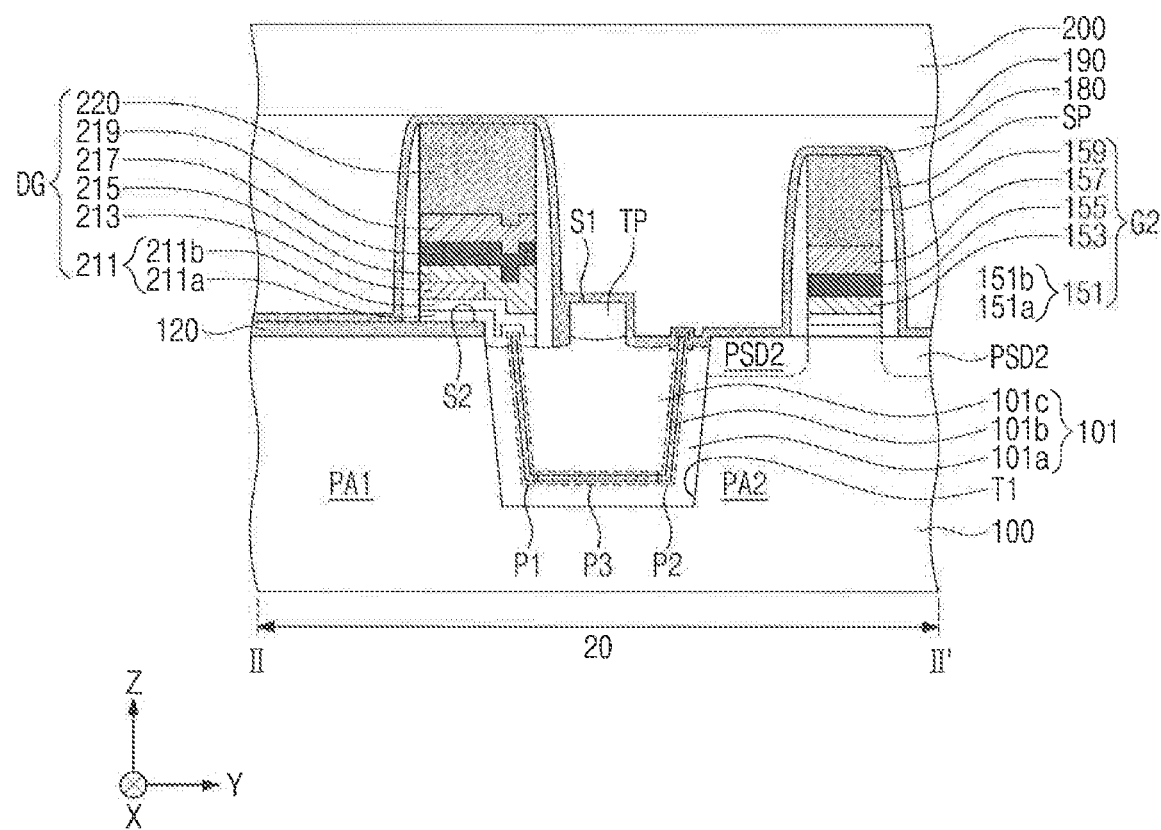
FIG. 8 illustrates a cross-sectional view taken along line II-II' of FIG. 1, showing a semiconductor device according to an exemplary embodiment of the present inventive concepts.

FIG. 8 illustrates a cross-sectional view taken along line II-II' of FIG. 1, showing a semiconductor device according to an exemplary embodiment of the present inventive concepts.

Referring to FIG. 8, the dummy gate pattern DG may be partially disposed on the top surface S2 of the semiconductor layer 120. For example, the dummy gate dielectric pattern 211 of the dummy gate pattern DG may be disposed on a portion of the top surface S2 of the semiconductor layer 120 and extend onto the top surface of the device isolation layer 101 on the peripheral circuit section 20 of the substrate 100. The dummy gate pattern DG may directly contact a portion of the top surface S2 of the semiconductor layer 120, the sidewall of the semiconductor layer 120 adjacent to the device isolation layer 101 on the peripheral circuit section 20 of the substrate 100, the top surface of the first liner layer 101a adjacent to the semiconductor layer 120, the top surface and sidewalls of the first vertical segment P1 of the second liner layer 101b, and a portion of the top surface of the buried dielectric layer 101c. In certain exemplary embodiments, the top surface S2 of the semiconductor layer 120 may be located at a higher level (e.g., in the Z direction) from the top surface of the substrate 100 than the top surface of the first liner layer 101a adjacent to the semiconductor layer 120 and the top surface of the buried dielectric layer 101c. Therefore, the portion of the dummy gate dielectric pattern 211 disposed on the top surface S2 of the semiconductor layer 120 may have a top surface that is higher (e.g., in the Z direction) from the top surface of the substrate 100 than the top surface of the portion of the dummy gate dielectric pattern 211 disposed on the top surface of the device isolation layer 101.

The dummy gate pattern DG may be physically spaced apart from the protrusion TP (e.g., in the Y direction) that protrudes from the top surface of the buried dielectric layer 101c. One dummy spacer DSP on one sidewall of the dummy gate pattern DG may be disposed on the top surface S2 of the semiconductor layer 120 and extend (e.g., in the Z direction) to cover sidewalls of the dummy gate pattern. The other dummy spacer DSP disposed on an opposing sidewall of the dummy gate pattern DG may be disposed on the top surface of the buried dielectric layer 101c and extend (e.g., in the Z direction) to cover sidewalls of the dummy gate pattern.

FIGS. 9A to 9I illustrate cross-sectional views taken along lines I-I' and II-II' of FIG. 1, showing a method of fabricating a semiconductor device according to exemplary embodiments of the present inventive concepts.

Figure 9A:
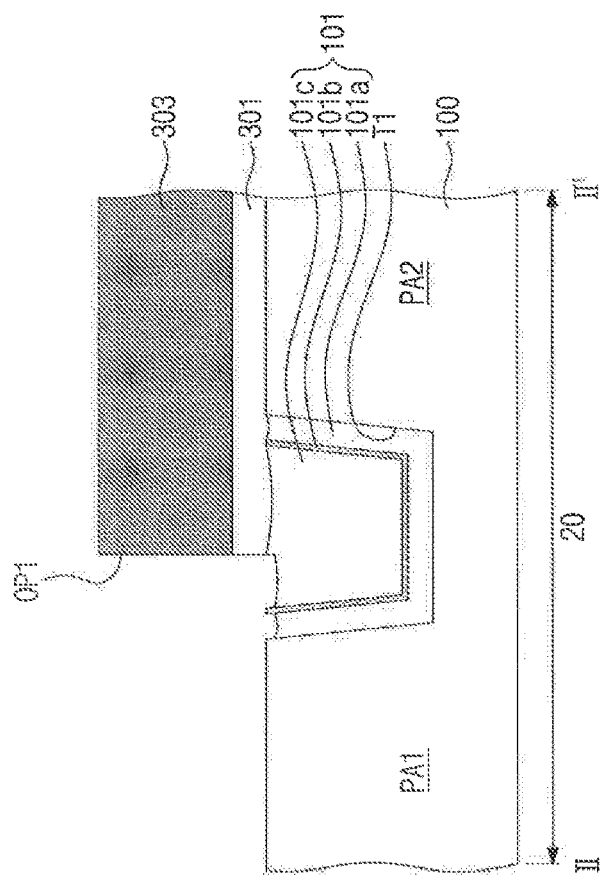
FIGS. 9A to 9I illustrate cross-sectional views taken along lines I-I' and II-II' of FIG. 1, showing a method of fabricating a semiconductor device according to exemplary embodiments of the present inventive concepts.
Figure 9A:
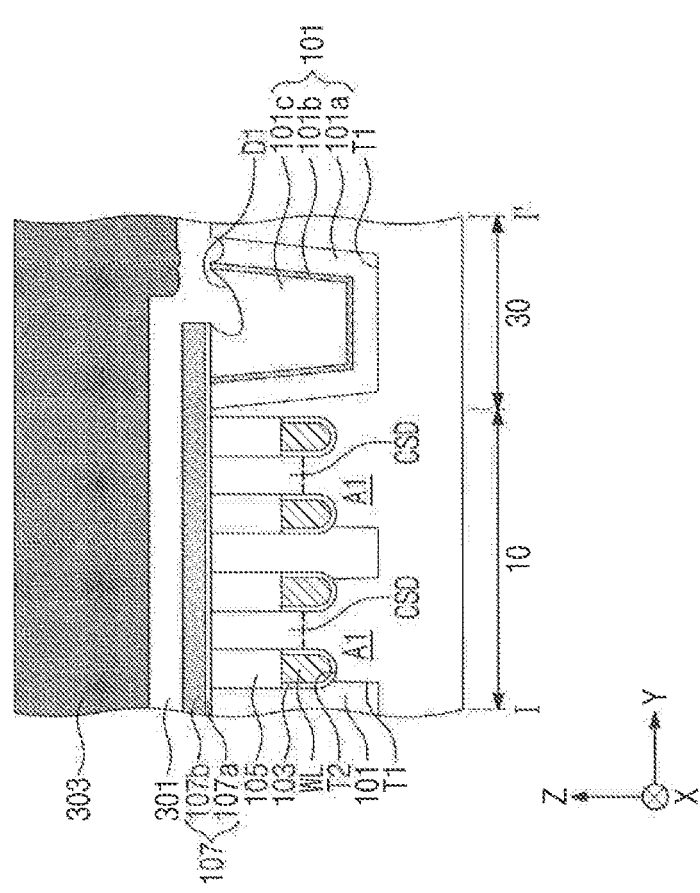

Referring to FIG. 9A, a device isolation layer 101 may be formed in a substrate 100. The formation of the device isolation layer 101 may include performing an etching process on the substrate 100 to form a device isolation trench T1, forming a dielectric layer to fill the device isolation trench T1, and performing a planarization process to etch the dielectric layer until a top surface of the substrate 100 is exposed.

The device isolation layer 101 defines a cell array section 10, a peripheral circuit section 20, and an interface section 30 on the substrate 100. For example, the interface section 30, the cell array section 10 and the peripheral circuit section 20 may be arranged in the Y direction on the substrate 100. The interface section 30 may be disposed between the cell array section 10 and the peripheral circuit section 20. The device isolation layer 101 may be formed on the cell array section 10, the peripheral circuit section 20, and the interface section 30 of the substrate 100. The device isolation layer 101 formed on the cell array section 10 may define cell active regions A1 on the cell array section 10 of the substrate 100. The cell active regions A1 may be formed parallel to each other in the Z direction. The device isolation layer 101 formed on the peripheral circuit section 20 may define a first peripheral circuit active region PA1 and a second peripheral circuit active region PA2 on the peripheral circuit section of the substrate 100. The first peripheral circuit active region PA1 and the second peripheral circuit active region PA2 may be spaced apart in the Y direction.

The device isolation layer 101 formed on the cell array section 10 of the substrate 100 may include a dielectric layer. The dielectric layer may completely fill the device isolation trench T1 formed on the cell array section 10 of the substrate 100. In an exemplary embodiment, the dielectric layer may include a silicon oxide layer. However, exemplary embodiments of the present inventive concepts are not limited thereto. The device isolation layer 101 formed on the cell array section 10 of the substrate 100 may consist of a single layer. The device isolation layer 101 formed on the peripheral circuit section 20 and the interface section 30 of the substrate 100 may include a first liner layer 101a, a second liner layer 101b, and a buried dielectric layer 101c that are sequentially formed in the device isolation trench T1. The first liner layer 101a may conformally cover a bottom surface and sidewalls of the device isolation trench T1. The second liner layer 101b may conformally cover a bottom surface and sidewalls of the first liner layer 101a. The buried dielectric layer 101c may be formed on the second liner layer 101b and may completely fill the device isolation trench T1 in which the first and second liner layers 101a and 101b are formed.

Cell gate trenches T2 may be formed in the substrate 100 of the cell array section 10. The cell gate trenches T2 may be formed to extend in the X direction intersecting the third direction Z, running across the cell active regions A1. Cell source/drain regions CSD may be formed in the cell active regions A1. The cell source/drain regions CSD may be formed by forming an ion implantation mask on the substrate 100 and then performing an ion implantation process on the substrate 100 exposed by (e.g., not covered by) the ion implantation mask. Alternatively, the ion implantation process may be carried out without the ion implantation The cell source/drain regions CSD may each have a conductive type (e.g., N-type) different from that of the substrate 100.

Gate dielectric layers 103 and word lines WL may be formed on bottom surfaces of the cell gate trenches T2 and on portions of sidewalls of the cell gate trenches T2. For example, the formation of the gate dielectric layers 103 and the word lines WL may include forming a gate dielectric layer to conformally cover the bottom surfaces and sidewalls of the cell gate trenches T2, forming a metal layer to fill the cell gate trenches T2, and partially etching the gate dielectric layer and the metal layer that fill upper portions of the cell gate trenches T2. Upper sidewalls of the cell gate trenches T2 may be exposed by the gate dielectric layers 103 and the word lines WL. The word lines WL may be formed to have their top surfaces (e.g., in the Z direction) at the same level as the top surfaces of the gate dielectric layers 103. The top surface of the substrate 100 may be located at a higher level (e.g., in the Z direction) than the top surfaces of the word lines WL and the top surfaces of the gate dielectric layers 103. Gate capping patterns 105 may be formed to fill the cell gate trenches T2 above the word lines WL and the gate dielectric layers 103. The top surfaces of the gate capping patterns 105 may be coplanar with the top surface of the substrate 100.

A buffer layer 107 may be formed on the cell array section 10 and the interface section 30 of the substrate 100. In an exemplary embodiment, the formation of the buffer layer 107 may include forming a buffer material layer on the cell array section 10, the peripheral circuit section 20, and the interface section 30 of the substrate 100, forming an etch mask on the cell array section 10 and a first portion of the interface section 30 of the substrate 100, and using the etch mask to etch the buffer material layer formed on the peripheral circuit section 20 and a second portion of the interface section 30 of the substrate 100. The buffer layer 107 may be formed to cover a top surface of the device isolation layer 101 formed on the cell array section 10 of the substrate 100, the top surface of the substrate 100 of the cell array section 10, and the top surfaces of the gate capping patterns 105. The buffer layer 107 may be formed to cover a portion of the top surface of the device isolation layer 101 formed in the substrate 100 of the interface section 30. The buffer layer 107 may include a first buffer layer 107a and a second buffer layer 107b that are sequentially stacked on the substrate 100.

After the buffer layer 107 is formed, an etching process may be performed on a native oxide layer that is undesirably formed on the top surface of the substrate 100 exposed by the buffer layer 107. Therefore, the etching process may etch byproducts including oxide that are exposed by the buffer layer 107. For example, the etching process may etch each upper portion of the buried dielectric layer 101c and the first liner layer 101a in the device isolation layer 101 disposed on the second portion of the interface section 30. The etching process may also etch each upper portion of the first liner layer 101a and the buried dielectric layer 101c in the device isolation layer 101 disposed on the peripheral circuit section 20 exposed by the buffer layer 107. Therefore, on the interface section 30 exposed by the buffer layer 107, the first liner layer 101a may be etched to have a concave top surface, and on the peripheral circuit section 20 exposed by the buffer layer 107, each of the first liner layer 101a and the buried dielectric layer 101c may also be etched to have a concave top surface. Further, a portion of the buried dielectric layer 101c on the interface section 30 may be over-etched to form a first dent D1 that is recessed from the top surface of the substrate 100 (e.g., in the Z direction). The first dent D1 may be a concave surface extending toward the cell array section 10 (e.g., in the Y direction). In an exemplary embodiment, the etching process on the native oxide layer may include one or more of a plasma dry cleaning process and a wet cleaning process. However, exemplary embodiments of the present inventive concepts are not limited thereto. The plasma dry cleaning process may use a hydrogen gas, and the wet cleaning process may use hydrogen fluoride (HF).

A first mask layer 301 may be formed on the top surface of the substrate 100. The first mask layer 301 may be formed to cover the top surface of the substrate 100 on the cell array section 10 and the interface section 30 including the first dent D1, the top surface of the substrate 100 of the second peripheral circuit active region PA2 on the peripheral circuit section 20, and a portion of the top surface of the device isolation layer 101 adjacent to the second peripheral circuit active region PA2. In an exemplary embodiment, the formation of the first mask layer 301 may include forming a dielectric layer to cover a top surface and sidewall of the buffer layer 107, the top surface of the device isolation layer 101 on the interface section 30, the top surface of the substrate 100 of the first peripheral circuit active region PA1, the top surface of the substrate 100 of the second peripheral circuit active region PA2, and the top surface of the device isolation layer 101 on the peripheral circuit section 20 of the substrate 100. A first mask pattern 303 is formed on the dielectric layer to cover the top surfaces of the interface section 30 and the second peripheral circuit active region PA2 and locally exposing the dielectric layer formed on the substrate 100 of the first peripheral circuit active region PA1. An etching process is performed in which the first mask pattern 303 is used as an etch mask to remove the dielectric layer formed on the substrate 100 of the first peripheral circuit active region PA1 to expose the top surface of the substrate 100 of the first peripheral circuit active region PA1. As shown in the exemplary embodiment of FIG. 9A, the first mask pattern 303 may have a first opening OP1 to expose the substrate 100 of the first peripheral circuit active region PA1. To obtain a process margin for completely exposing an entire top surface of the substrate 100 of the first peripheral circuit active region PA1 when a subsequent etching process is performed, the first opening OP1 of the first mask pattern 303 may have a width (e.g., in the Y direction) that is greater than the width of the first peripheral circuit active region PA1. Therefore, the first opening OP1 may expose a portion of the top surface of the device isolation layer 101 adjacent to the first peripheral circuit active region PA1 on the peripheral circuit section 20 of the substrate 100.

Therefore, the etching process for forming the first mask layer 301 may etch a portion of the top surface of the device isolation layer 101 adjacent to the first peripheral circuit active region PA1 on the peripheral circuit section 20 of the substrate 100. As a result, on the peripheral circuit section 20, the top surface of the buried dielectric layer 101c and the top surface of the first liner layer 101a of the device isolation layer 101 adjacent to the first peripheral circuit active region PA1 may be recessed (e.g., in the Z direction) from the top surface of the substrate 100 and/or from the top surface of the second liner layer 101b. In addition, on the peripheral circuit section 20, the first liner layer 101a and the buried dielectric layer 101c may expose a top surface and upper sidewalls of the second liner layer 101b exposed by the first mask layer 301. In an exemplary embodiment, the etching process may include, for example, a dry or wet etching process. The first mask layer 301 may include, for example, a silicon oxide layer. The first mask pattern 303 may include, for example, a photoresist pattern. However, exemplary embodiments of the present inventive concepts are not limited thereto.

When an epitaxial process is performed in a subsequent process, the first mask layer 301 may serve to form an epitaxial layer only on the first peripheral circuit active region PA1 and to prevent epitaxial growth on areas other than the first peripheral circuit active region PA1. The first mask layer 301 may be formed to have a thickness that is sufficient to completely fill the first dent D1. After the etching process is terminated, the first mask pattern 303 may be removed by an ashing process or a strip process.

Figure 9B:
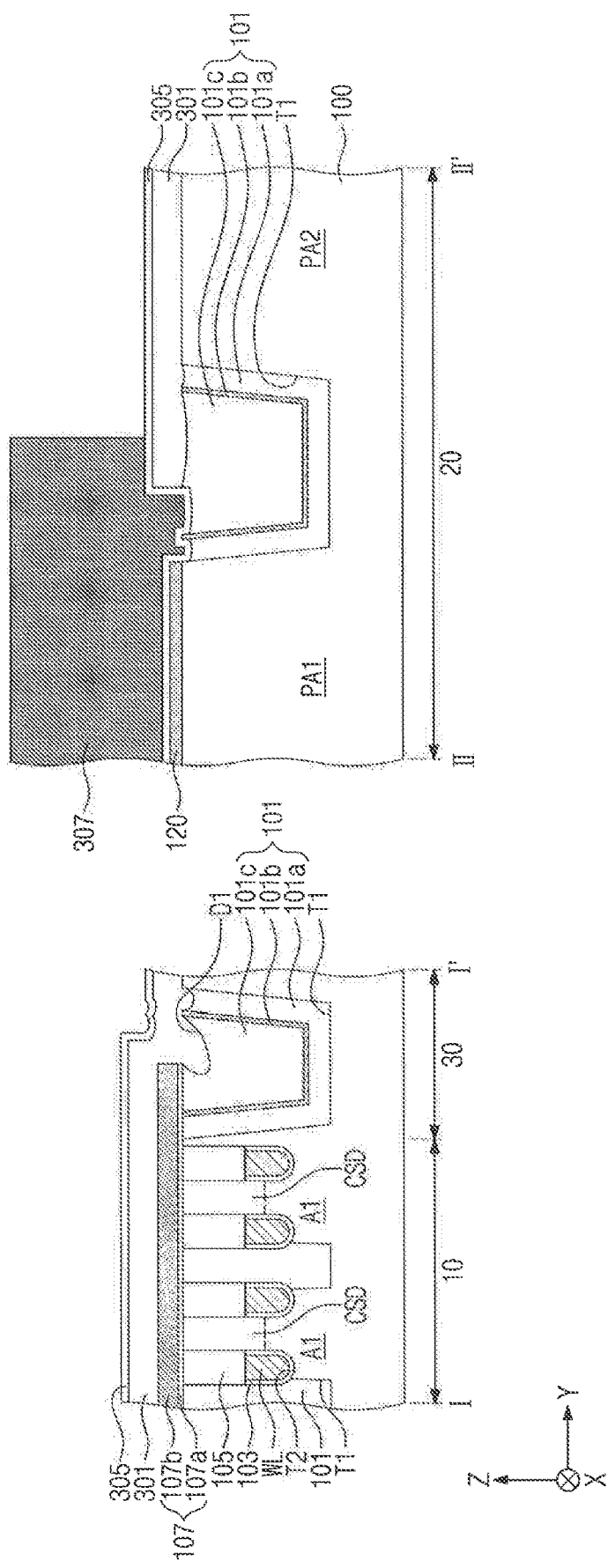

Referring to FIG. 9B, a semiconductor layer 120 may be formed on the first peripheral circuit active region PA1. The semiconductor layer 120 may be formed by performing a selective epitaxial growth process on the substrate 100 of the first peripheral circuit active region PA1 exposed by the first mask layer 301. The semiconductor layer 120 may be formed of compound semiconductor. For example, the semiconductor layer 120 may include SiGe. However, exemplary embodiments of the present inventive concepts are not limited thereto. A protective layer 305 may be formed to conformally cover a top surface and sidewall of the first mask layer 301, a top surface and sidewall of the semiconductor layer 120, and the top surface of the device isolation layer 101 exposed by the first mask layer 301 on the peripheral circuit section 20. The protective layer 305 may prevent the semiconductor layer 120 from directly contacting a second mask pattern 307 formed in a subsequent process. However, in certain exemplary embodiments, the protective layer 305 may be omitted. In an exemplary embodiment, the protective layer 305 may include a silicon oxide layer. However, exemplary embodiments of the present inventive concepts are not limited thereto.

A second mask pattern 307 may be formed on the protective layer 305. The second mask pattern 307 may be formed on the protective layer 305 disposed on the first peripheral circuit active region PA1 of the substrate 100 and on a portion of the protective layer disposed on the device isolation layer 101 on the peripheral circuit section 20 of the substrate 100. The second mask pattern 307 may expose a top surface of the protective layer 305 formed on the cell array and interface sections 10 and 30 of the substrate 100. The second mask pattern 307 may also expose the top surface of the protective layer 305 formed on the second peripheral circuit active region PA2. The second mask pattern 307 may prevent the top surface of the device isolation layer 101 adjacent to the semiconductor layer 120 from being deeply etched from the top surface of the substrate 100. Therefore, the second mask pattern 307 may be formed to essentially cover the portion of the protective layer 305 on the top surface of the device isolation layer 101 adjacent to the semiconductor layer 120. In an exemplary embodiment, the second mask pattern 307 may include a photoresist pattern. However, exemplary embodiments of the present inventive concepts are not limited thereto.

In some exemplary embodiments, as shown in FIG. 9B, the second mask pattern 307 may be formed to overlap the first peripheral circuit active region PA1 and a portion of the first mask layer 301 above the device isolation layer 101 adjacent to the first peripheral circuit active region PA1. The second mask pattern 307 may not be formed on a portion overlapping the top surface of the device isolation layer 101 adjacent to the second peripheral circuit active region PA2. In other exemplary embodiments, the second mask pattern 307 may be disposed to overlap an entire top surface of the device isolation layer 101 on the peripheral circuit section 20 of the substrate 100 and does not overlap the second peripheral circuit active region PA2. In other exemplary embodiments the second mask pattern 307 may disposed to overlap an entire top surface of the device isolation layer 101 on the peripheral circuit section 20 of the substrate 100 and a portion of the substrate 100 of the second peripheral circuit active region PA2.

Figure 9C:
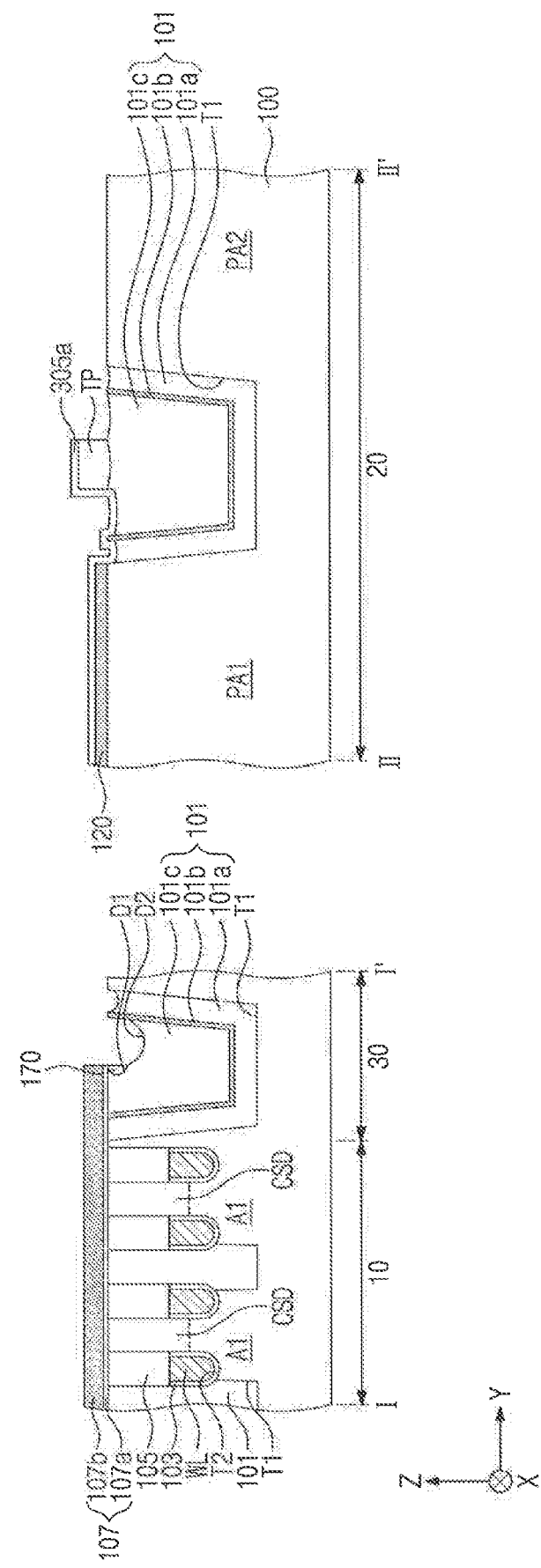

Referring to FIG. 9C, an etching process may be performed in which the second mask pattern 307 is used as an etch mask to etch the protective layer 305 and the first mask layer 301. After the etching process is performed, the buffer layer 107 may be exposed on its top surface and sidewall on the cell array section 10 and the interface section 30 of the substrate 100, and the device isolation layer 101 may be exposed on its top surface on the interface section 30 exposed by the buffer layer 107. A portion of the first mask layer 301 filling the first dent D1 may not be etched to form a residual pattern 170 in the first dent D1. On the interface section 30, when the etching process is performed, each of the first liner layer 101a and the buried dielectric layer 101c may be etched on its upper portion exposed by the removal of the protective layer 305 and the first mask layer 301. Therefore, a second dent D2 may be formed in the buried dielectric layer 101c, and the top surface of the first liner layer 101a may be further recessed (e.g., in the Z direction) from the top surface of the substrate 100.

The etching process may form a protective pattern 305a and a protruding pattern TP on the peripheral circuit section 20 of the substrate 100, and may expose the top surface of the substrate 100 of the second peripheral circuit active region PA2 and a portion of the top surface of the device isolation layer 101 adjacent to the second peripheral circuit active region PA2. The protective pattern 305a may conformally cover the top surface of the semiconductor layer 120, a sidewall of the semiconductor layer, the top surface of the device isolation layer 101 between the semiconductor layer 120 and the protruding pattern TP, and a top surface and one sidewall of the protruding pattern TP. The protruding pattern TP may be formed on the top surface of the buried dielectric layer 101c. It may be understood that the protruding pattern TP corresponds to the protrusion TP discussed with reference to FIGS. 1 and 2, and thus the protruding pattern TP may also be called herein the protrusion. The etching process may etch the buried dielectric layer 101c and the first liner layer 101a of the device isolation layer 101 between the protrusion TP and the second peripheral circuit active region PA2. Therefore, the top surfaces of the buried dielectric layer 101c and the first liner layer 101a between the protrusion TP and the second peripheral circuit active region PA2 may be further recessed (e.g., in the Z direction) from the top surface of the substrate 100 and/or from the top surface of the second liner layer 101b. The etching process may include a wet etching process. The wet etching process may use hydrofluoric acid or phosphoric acid. However, exemplary embodiments of the present inventive concepts are not limited thereto.

In certain exemplary embodiments, as discussed with reference to FIG. 9B, the position in which the protrusion TP is formed may depend on the arrangement of the second mask pattern 307. For example, as shown in FIGS. 4 to 8, the position of the protrusion TP may may be changed depending on how much of the first mask layer 301 is covered with the second mask pattern 307 and/or depending on whether the first mask layer 301 completely or partially covers the top surface of the device isolation layer 101 on the peripheral circuit section 20. In addition, as shown in FIG. 3, depending on the arrangement of the second mask pattern 307, the protrusion TP may not be formed and the top surface of the device isolation layer 101 may be deeply recessed on the peripheral circuit section 20. In this embodiment as illustrated in FIG. 9B, the second mask pattern 307 may expose a portion of the top surface of the device isolation layer 101 exposed by the first mask layer 301 on the peripheral circuit section 20.

According to some exemplary embodiments of the present inventive concepts, the second mask pattern 307 may be formed on a portion of the top surface of the device isolation layer 101 adjacent to the semiconductor layer 120 on the peripheral circuit section 20. Therefore, the top surface of the first liner layer 101a adjacent to the semiconductor layer 120 may be prevented from being further recessed from the top surface of the substrate 100. The first liner layer 101a is already etched in the etching process for exposing the top surface of the substrate 100 of the first peripheral circuit active region PA1. Therefore, it may be possible to reduce a recess depth between the top surface of the semiconductor layer 120 and the top surface of the first liner layer 101a adjacent to the semiconductor layer 120. In a subsequent process, a gate pattern made of a conductive material may be prevented from remaining on the first liner layer 101a. As a result, a semiconductor device may improve in reliability.

Figure 9D:
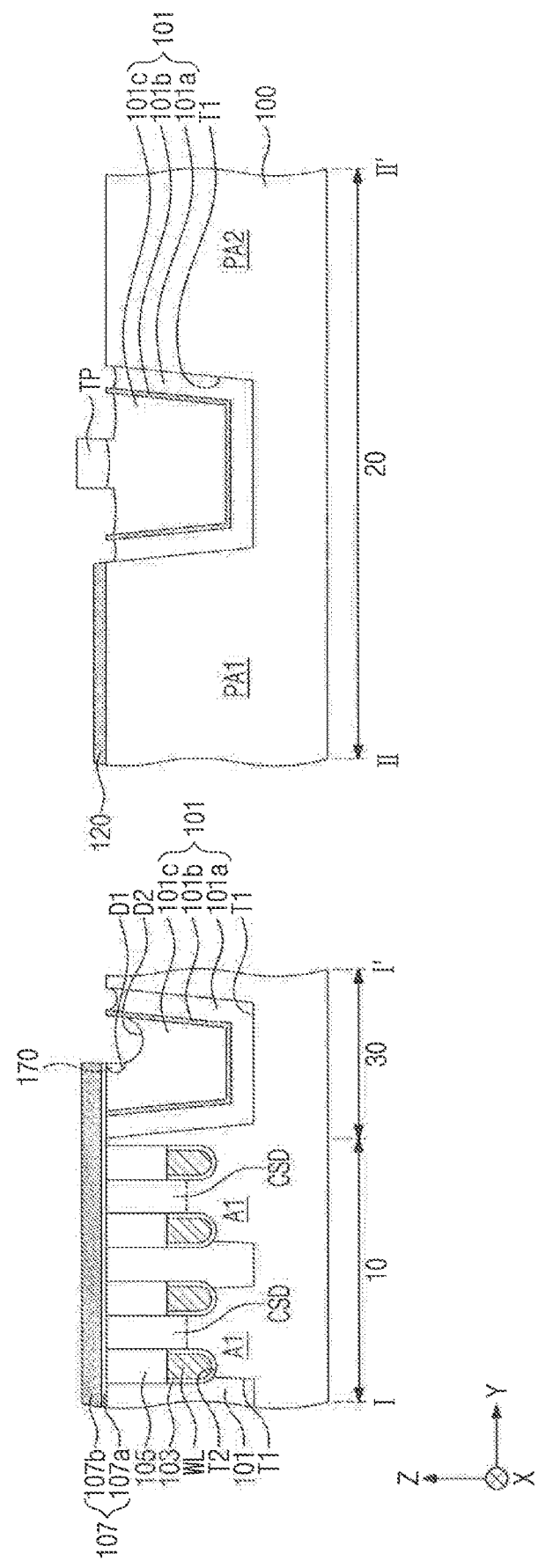

Referring to FIG. 9D, an etching process may be performed to remove the protective pattern 305a. The etching process may expose the top surface and the sidewall of the protrusion TP that was covered by the protective pattern 305a, the top surface and sidewall of the semiconductor layer 120, and a portion of the top surface of the device isolation layer 101 between the semiconductor layer 120 and the protrusion TP. In an exemplary embodiment, the etching process may include a dry etching process or a wet etching process. However, exemplary embodiments of the present inventive concepts are not limited thereto.

Figure 9E:
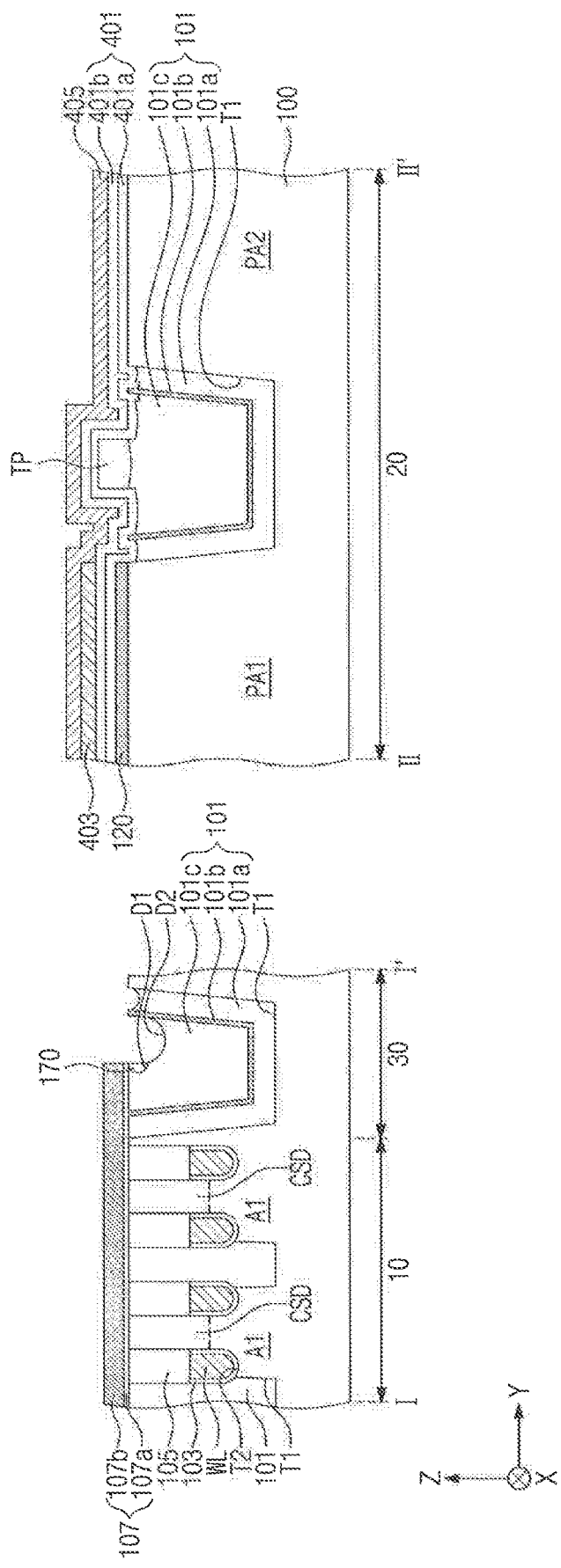

Referring to FIG. 9E, a peripheral circuit gate dielectric layer 401 may be formed on the peripheral circuit section 20 of the substrate 100. The peripheral circuit gate dielectric layer 401 may conformally cover the top surface and a sidewall of the semiconductor layer 120 and the top surface of the device isolation layer 101 on the peripheral circuit section 20, the top surface and sidewalls of the protrusion TP, and the top surface of the substrate 100 of the second peripheral circuit active region PA2. The peripheral circuit gate dielectric layer 401 may include an oxide layer 401a and a dielectric layer 401b that are sequentially formed on the peripheral circuit section 20 of the substrate 100. The oxide layer 401a may include, for example, a silicon oxide layer or a thermal oxide layer. The dielectric layer 401b may include a high-k dielectric layer, such as $HfO_2$, $Al_2O_3$, $HfAlO_3$, $Ta_2O_3$, or $TiO_2$. However, exemplary embodiments of the present inventive concepts are not limited thereto.

A first conductive type metal layer 403 may be formed on the first peripheral circuit active region PA1. The first conductive type metal layer 403 may be locally formed on the substrate 100 of the first peripheral circuit active region PA1. The first conductive type metal layer 403 may expose (e.g., not cover) the peripheral circuit gate dielectric layer 401 on the top surface of the device isolation layer 101 on the peripheral circuit section 20, the peripheral circuit gate dielectric layer on the top surface and sidewalls of the protrusion TP, the peripheral circuit gate dielectric layer 401 formed on a top surface of the second peripheral circuit active region PA2, the top surface and sidewall of the buffer layer 107 on the cell array section, and a portion of the top surface of the device isolation layer 101 on the interface section 30. The first conductive type metal layer 403 may be a metal layer that controls a threshold voltage $V_{th}$ of a P– P-type gate electrode. For example, the first conductive type metal layer 403 may include one or more of an aluminum layer, an aluminum oxide layer, a titanium nitride layer, a tungsten nitride layer, and a ruthenium oxide layer. However, exemplary embodiments of the present inventive concepts are not limited thereto.

A second conductive type metal layer 405 may be formed on the peripheral circuit section 20 of the substrate 100. The second conductive type metal layer 405 may cover a top surface and sidewall of the first conductive type metal layer 403 and the top surface of the peripheral circuit gate dielectric layer 401 exposed by the first conductive type metal layer 403. The second conductive type metal layer 405 may be a metal layer that controls a threshold voltage $V_{th}$ of an N-type gate electrode. The second conductive type metal layer 405 may include one or more of a lanthanum layer, a lanthanum oxide layer, a tantalum layer, a tantalum nitride layer, a niobium layer, and a titanium nitride layer. However, exemplary embodiments of the present inventive concepts are not limited thereto.

Figure 9F:
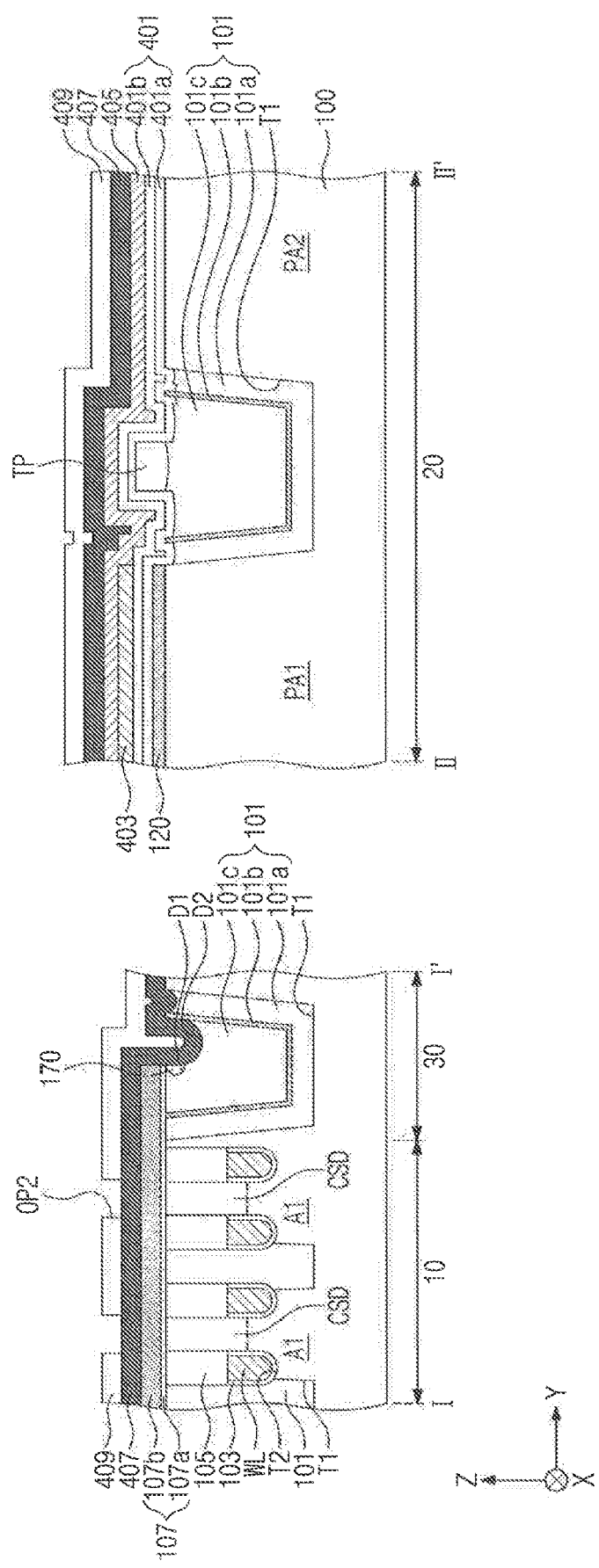

Referring to FIG. 9F, a conductive layer 407 and a second mask layer 409 may be sequentially formed on the substrate 100. The conductive layer 407 may be conformally formed on the top surface and sidewall of the buffer layer 107 in the cell array section 10 and a portion of the interface section 30, a portion of the top surface of the device isolation layer 101 exposed by the buffer layer 107 on the interface section 30, and a top surface of the second conductive type metal layer 405 formed on the peripheral circuit section 20 of the substrate 100. The conductive layer 407 may be conformally formed to cover a bottom surface and sidewalls of the second dent D2. The conductive layer 407 may include, for example, doped polysilicon, tungsten, molybdenum, gold, copper, aluminum, nickel, or cobalt. However, exemplary embodiments of the present inventive concepts are not limited thereto.

The second mask layer 409 may be formed to cover a top surface of the conductive layer 407 formed on the cell array section 10, the peripheral circuit section 20, and the interface section 30 of the substrate 100. The second mask layer 409 may have second openings OP2. For For example, the second openings OP2 may be disposed in the cell array section 10. The second second openings OP2 may partially expose the conductive layer 407 formed on the cell array section 10 of the substrate 100. For example, the second openings OP2 may expose central portions of the cell active regions A1 between a pair of word lines WL running across each of the cell active regions A1. The second mask layer 409 may completely fill the second dent D2. The second mask layer 409 may include, for example, one or more of a silicon oxide layer, a silicon nitride layer, and a silicon oxynitride layer. However, exemplary embodiments of the present inventive concepts are not limited thereto.

Figure 9G:
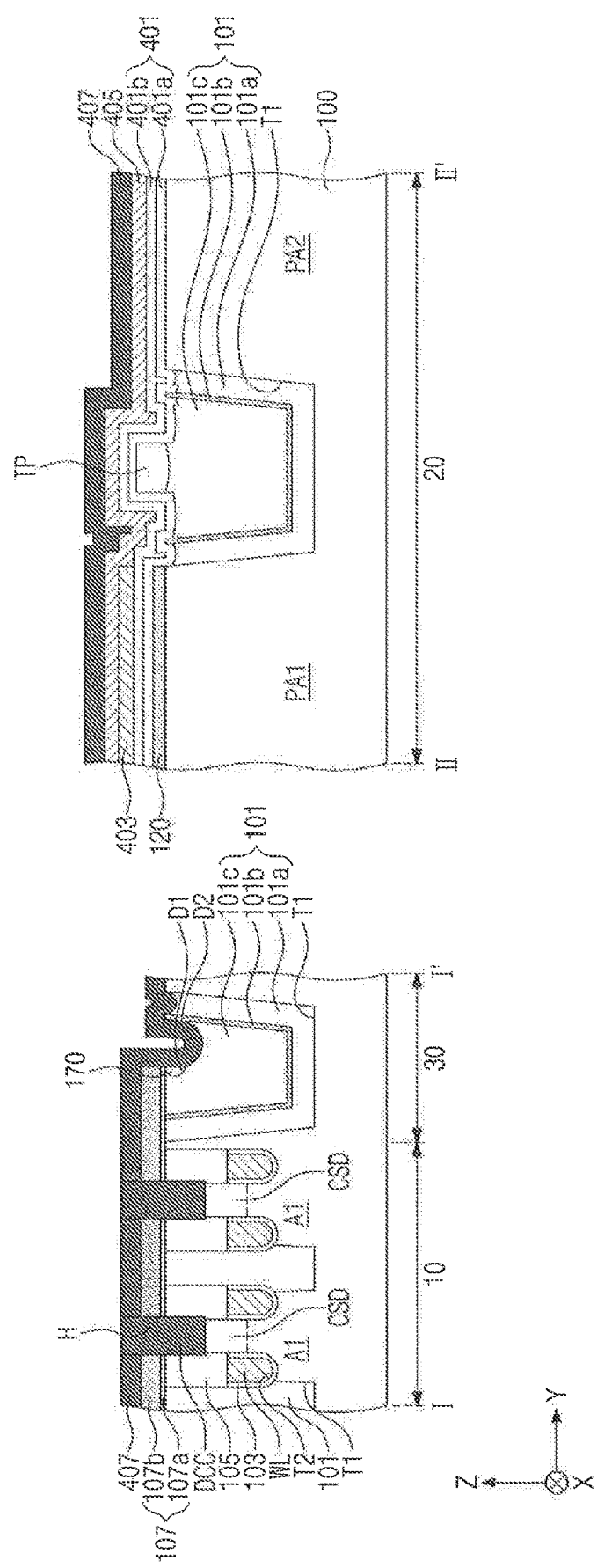

Referring to FIG. 9G, the second mask layer 409 may be used as an etch mask to sequentially and partially etch the conductive layer 407, the buffer layer 107, and the substrate 100 that are overlap the second openings OP2 (e.g., in the Z direction). Therefore, contact holes H may be formed in the central portions of the cell active regions A1 exposed by the word lines WL. The contact holes H may expose the cell source/drain regions CSD formed in the central portions of the cell active regions A1. The second mask layer 409 may be removed after the formation of the contact holes H. Bit line node contacts DCC may be formed in the contact holes H. The formation of the bit line node contacts DCC may include forming a node layer, filling the contact holes H and covering the top surface of the conductive layer 407. A planarization process may be performed to etch the node layer and to expose the top surface of the conductive layer 407.

Figure 9H:
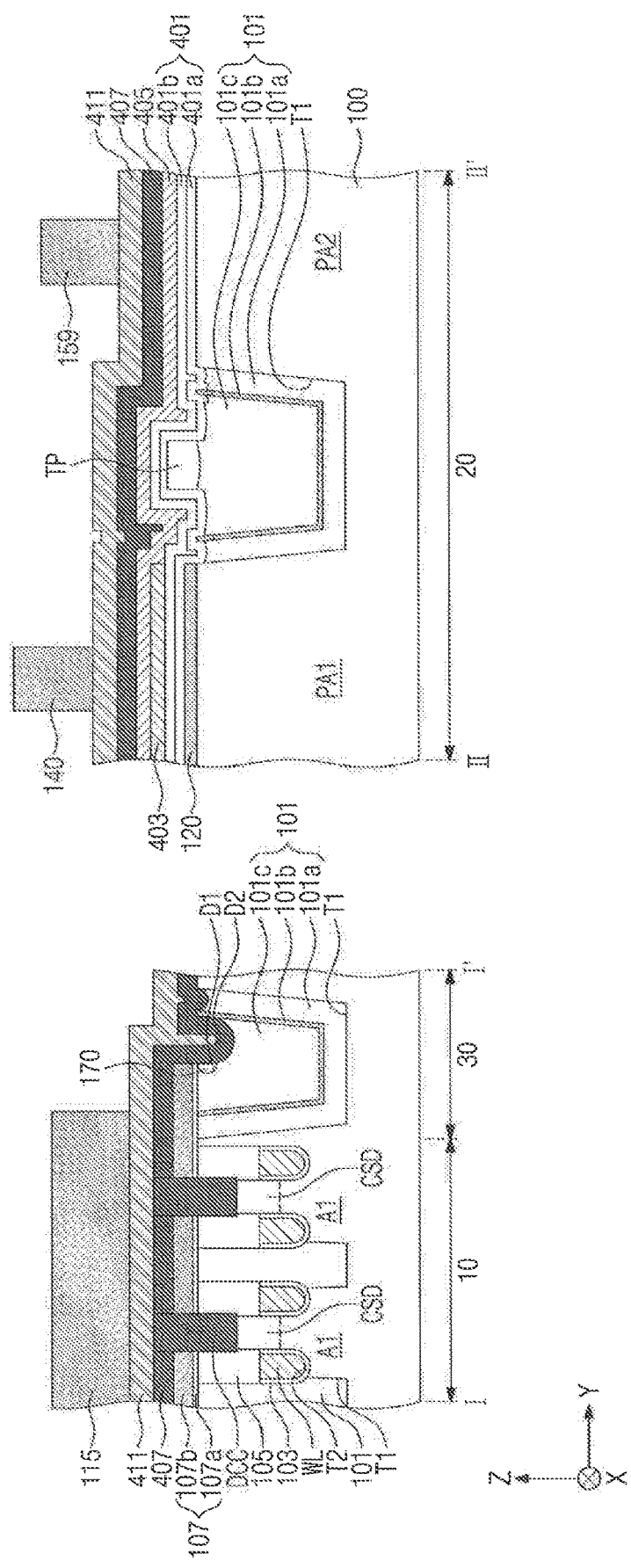

Referring to FIG. 9H, a metal layer 411 may be formed on the top surface of the conductive layer 407. The metal layer 411 may be formed to conformally cover the top surface of the conductive layer 407 on the peripheral circuit section 20 of the substrate 100, the top surface of the conductive layer 407 on the cell array section 10 of the substrate 100, and top surfaces of the bit line node contacts DCC. The conductive layer 407 may fill the second dent The metal layer 411 may include, for example, one or more of TiSiN, TiN, TaN, metal, and metal silicide. The metal and the metal silicide may include, for example, tungsten, gold, copper, aluminum, nickel, or cobalt. However, exemplary embodiments of the present inventive concepts are not limited thereto.

First capping patterns 115, a second capping pattern 140, and a third capping pattern 159 may be formed on a top surface of the metal layer 411. The first capping patterns 115 may be formed on the cell array section 10 and on a portion of the interface section 30 of the substrate 100. The first capping patterns 115 formed on the cell array section 10 of the substrate 100 may extend in the Y direction and may be arranged in the first direction X. The second capping pattern 140 may be formed on the top surface of the metal layer 411 on a central portion of the first peripheral circuit active region PA1 of the substrate 100. The third capping pattern 159 may be formed on the top surface of the metal layer 411 on a central portion of the second peripheral circuit active region PA2 of the substrate 100. The first, second, and third capping patterns 115, 140, and 159 may be formed at the same time. The first capping patterns 115, the second capping pattern 140, and the third capping pattern 159 may expose (e.g., not cover) a portion of the metal layer 411 formed on the device isolation layer 101 on the interface section 30 of the substrate 100, portions of the metal layer formed on lateral side portions of the first and second peripheral circuit active regions PA1, PA2 and also expose the metal layer formed on the device isolation layer 101 on the peripheral circuit section 20 of the substrate 100.

Figure 9I:
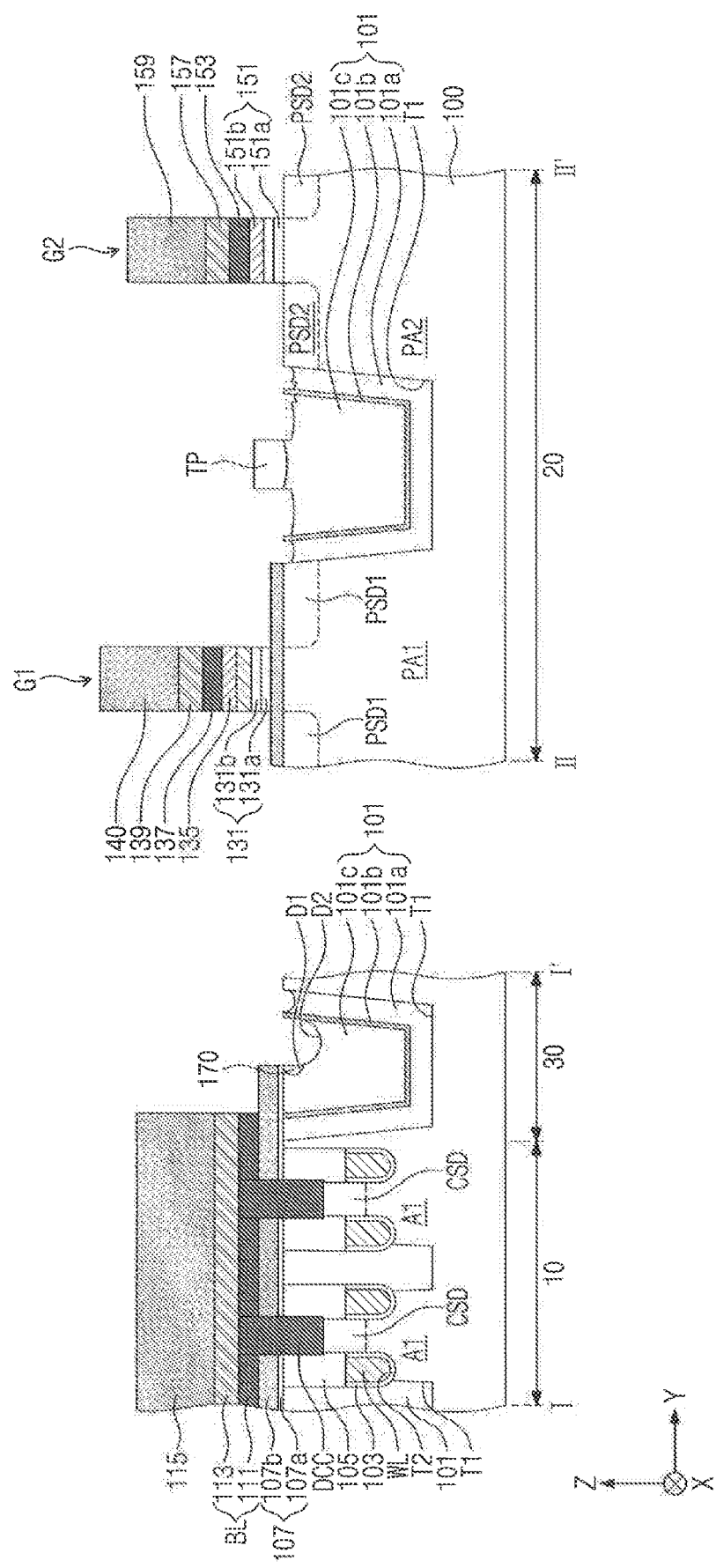

Referring to FIG. 9I, an etching process may be performed in which the first, second, and third capping patterns 115, 140, and 159 are used as an etch mask to sequentially etch the metal layer 411, the conductive layer 407, the second conductive type metal layer 405, the first conductive type metal layer 403, and the peripheral circuit gate dielectric layer 401. For example, the first capping pattern 115 may be used as an etch mask to remove the conductive layer 407 and the metal layer 411 that are stacked on the interface section 30 of the substrate Therefore, bit lines BL may be formed on the cell array section 10 of the substrate 100. Each of the bit lines BL may include a cell conductive pattern 111 and a cell metal pattern 113. The second and third capping patterns 140 and 159 may be used as an etch mask to pattern the metal layer 411, the conductive layer 407, the second conductive type metal layer 405, the first conductive type metal layer 403, and the peripheral circuit gate dielectric layer 401 that are stacked on the peripheral circuit section 20 of the substrate 100. Therefore, a first gate pattern G1 may be formed on the first peripheral circuit active region PA1 of the substrate 100, and a second gate pattern G2 may be formed on the second peripheral circuit active region PA2 of the substrate 100. The first gate pattern G1 may include a first gate dielectric pattern 131, a first conductive type metal pattern 133, a second conductive type metal pattern 135, a first conductive pattern 137, a first metal pattern 139, and a second capping pattern 140. The second gate pattern G2 may include a second gate dielectric pattern 151, a second conductive type metal pattern 153, a second conductive pattern 155, a second metal pattern 157, and a third capping pattern 159.

The etching process may expose a portion of the top surface of the semiconductor layer 120, the top surface and sidewalls of the protrusion TP, the top surface and sidewall of the buffer layer 107 on the interface section 30, a portion of the top surface of the device isolation layer 101 on the interface section 30, a portion of the top surface of the device isolation layer 101 on the peripheral circuit section 20, and a portion of the top surface of the substrate 100 of the second peripheral circuit active region PA2. First peripheral source/drain regions PSD1 may be formed in the substrate 100 on opposite sides of the first gate pattern G1 on the first peripheral circuit active region PA1. Second peripheral source/drain regions PSD2 may be formed in the substrate 100 on opposite sides of the second gate pattern G2 on the second peripheral circuit active region PA2.

Referring back to FIG. 2, spacers SP may be formed on sidewalls of the first and second gate patterns G1 and G2 and covering a top portion of the first and second peripheral circuit active regions PA1 and PA2. An etch stop layer 180 may be formed on the bit lines BL, the first and second gate patterns G1 and G2, and the protrusion TP. For example, the etch stop layer 180 may conformally cover a top surface and sidewall of the first capping pattern 115 formed on the bit lines BL, sidewalls of the bit lines BL, the sidewall and a portion of the top surface of the buffer layer 107, a portion of the top surface of the device isolation layer 101 on the interface section 30, a portion of the top surface of the semiconductor layer 120, sidewalls of the spacers SP, top surfaces of the first and second gate patterns G1 and G2, a portion of the top surface of the substrate 100 of the second peripheral circuit active region PA2, the top surface of the device isolation layer 101 on the peripheral circuit section 20, and the top surface and sidewalls of the protrusion TP.

First and second interlayer dielectric layers 190 and 200 may be formed on the etch stop layer 180. The first interlayer dielectric layer 190 may be formed to cover the etch stop layer 180. The first interlayer dielectric layer 190 may expose a top surface of the etch stop layer 180 formed on the top surface of the first gate pattern G1, and may cover a top surface of the etch stop layer 180 formed on each top surface of the bit line BL, the protrusion TP, and the second gate pattern G2. The second interlayer dielectric layer 200 may cover a top surface of the second interlayer dielectric layer 200. Storage node contacts, landing pads LP, and bottom electrodes BE may be sequentially formed.

According to some exemplary embodiments of the present inventive concepts, a device isolation layer may be formed on a peripheral circuit section of a substrate and to define first and second active regions. A portion of a top surface of the device isolation layer adjacent to the first active region may be prevented from being deeply recessed from a top surface of the substrate. The top surface of the substrate is in contact with a semiconductor layer disposed on the first active region of the substrate. Therefore, metal and/or conductive materials may be inhibited from remaining on the recessed device isolation layer, with the result that a semiconductor device may have improved reliability.

Although the present invention has been described in connection with some exemplary embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
a substrate including a first region and a second region;
a device isolation layer in the substrate between the first region and the second region, the device isolation layer including:
a buried dielectric layer in a trench that is recessed from a top surface of the substrate, and
a first liner layer between the trench and the buried dielectric lay;
a semiconductor layer on a top surface of the substrate of the first region;
a first gate pattern on the semiconductor layer; and
a protrusion on a top surface of the device isolation layer, the protrusion having an uppermost surface that overlaps the buried dielectric layer in a thickness direction of the substrate, the uppermost surface of the protrusion is positioned at a higher level than a level of an uppermost surface of the substrate, wherein the protrusion exposes a portion of a top surface of the buried dielectric layer,
wherein an etch stop layer directly contacts an entirety of sidewalls of the protrusion and a top surface of the protrusion.

2. The semiconductor device of claim 1, wherein
the buried dielectric layer has a concave top surface, and
the protrusion has a flat top surface.

3. The semiconductor device of claim 1, wherein the protrusion is spaced apart from the semiconductor layer.

4. The semiconductor device of claim 1, wherein the protrusion extends onto a top surface of the substrate of the second region.

5. The semiconductor device of claim 1, wherein the device isolation layer further includes a second liner layer between the first liner layer and the buried dielectric layer, wherein the protrusion directly contacts a top surface of the buried dielectric layer and is spaced apart from top surfaces of the first and second liner layers.

6. The semiconductor device of claim 1, wherein the device isolation layer further includes a second liner layer between the first liner layer and the buried dielectric layer, wherein the protrusion directly contacts top surfaces of the first and second liner layers and is spaced apart from a top surface of the buried dielectric layer.

7. The semiconductor device of claim 1, wherein the device isolation layer further includes a second liner layer between the first liner layer and the buried dielectric layer, wherein the protrusion directly contacts top surfaces of the first and second liner layers and a top surface of the buried dielectric layer.

8. The semiconductor device of claim 1, further comprising a dummy gate pattern on a top surface of the protrusion.

9. The semiconductor device of claim 1, wherein
the first gate pattern extends onto a portion of the top surface of the device isolation layer, the top surface of the device isolation layer being located at a level that is lower than the top surface of the substrate, and
the first gate pattern is spaced apart from the protrusion.

10. The semiconductor device of claim 1, Wherein the level of the uppermost surface of the protrusion is higher than a level of a top surface of the semiconductor layer.

11. The semiconductor device of claim 1, further comprising a second gate pattern on the second region of the substrate,
wherein the first gate pattern includes a first gate dielectric layer, a first conductive type metal layer, a second conductive type metal layer, a first polysilicon layer, and a first metal layer that are sequentially stacked on the semiconductor layer, and
wherein the second gate pattern includes a second gate dielectric layer, a third conductive type metal layer, a second polysilicon layer, and a second metal layer that are sequentially stacked on the substrate of the second region.

12. The semiconductor device of claim 1, wherein the semiconductor layer is an epitaxial layer.

13. The semiconductor device of claim 1, wherein the protrusion includes a same material as the buried dielectric layer.

14. A semiconductor device, comprising:
a substrate including a buried dielectric layer disposed in a trench that is recessed from a top surface of the substrate, the buried dielectric layer defining a first region and a second region of the substrate;
a semiconductor layer disposed directly on a top surface of the substrate of the first region;
a first gate pattern on the semiconductor layer and exposing a top surface and a sidewall of the semiconductor layer; and
an etch stop layer covering the top surface and the sidewall of the semiconductor layer exposed by the first gate pattern,
wherein the buried dielectric layer includes:
a first part adjacent to a first sidewall of the trench;
a second part adjacent to a second sidewall of the trench, the second sidewall facing the first sidewall; and
a third part between the first part and the second part, wherein
top surfaces of the first and second parts are recessed from the top surface of the substrate, and
a top surface of the third part is recessed from the top surfaces of the first and second parts,
wherein a lowermost surface of the semiconductor layer is positioned at a higher level than an uppermost surface of the buried dielectric layer.

15. The semiconductor device of claim 14, wherein a radius of curvature of the top surface of the third part is less than a radius of curvature of the top surface of the first part and a radius of curvature of the top surface of the second part.

16. A semiconductor device, comprising:
a substrate including a cell array section and a peripheral circuit section;
a first device isolation layer disposed in the substrate of the cell array section and defining a plurality of cell regions on the cell array section of the substrate;
a second device isolation layer disposed in the substrate of the peripheral circuit section and defining a first gate region and a second gate region on the peripheral circuit section of the substrate, the second device isolation layer including:
a buried dielectric layer in a trench recessed from a top surface of the substrate, and
a first liner layer between the trench and the buried dielectric layer;
a plurality of cell gate lines extending across the cell regions in one direction;
a semiconductor layer on a top surface of the substrate of the first gate region; and
a protrusion on a top surface of the second device isolation layer, the protrusion having an uppermost surface that overlaps the buried dielectric layer in a thickness direction of the substrate, the uppermost surface of the protrusion is positioned at a higher level than a level of an uppermost surface of the substrate, therein the protrusion exposes a portion of a top surface of the buried dielectric layer,
wherein an etch, stop layer directly contacts an entirety of sidewall of the protrusion and a top surface of the protrusion.

17. The semiconductor device of claim 16, wherein the second device isolation layer further includes a second liner layer between the first liner layer and the buried dielectric layer,
wherein the protrusion directly contacts with a top surface of the buried dielectric layer.

18. The semiconductor device of claim 16, wherein the second device isolation layer further includes a second liner layer between the first liner layer and the buried dielectric layer,
wherein the protrusion directly contacts a top surface of the first liner layer and a top surface of the second liner layer.

19. The semiconductor device of claim 16, wherein
a top surface of the first device isolation layer is located at a level lower than a top surface of the protrusion, and
the top surface of the second device isolation layer is exposed by the protrusion and is located at a level that is lower than the top surface of the first device isolation layer.

20. The semiconductor device of claim 16, wherein a top surface of the protrusion is located at a level that is higher than a top surface of the semiconductor layer.

* * * * *